US011862630B2

(12) United States Patent
Imam et al.

(10) Patent No.: US 11,862,630 B2
(45) Date of Patent: Jan. 2, 2024

(54) SEMICONDUCTOR DEVICE HAVING A BIDIRECTIONAL SWITCH AND DISCHARGE CIRCUIT

(71) Applicant: Infineon Technologies Austria AG, Villach (AT)

(72) Inventors: Mohamed Imam, Chandler, AZ (US); Hyeongnam Kim, Chandler, AZ (US); Kenneth Kin Leong, Villach (AT); Bhargav Pandya, Chandler, AZ (US); Gerhard Prechtl, Rosegg (AT)

(73) Assignee: Infineon Technologies Austria AG, Villach (AT)

( * ) Notice: Subject to any disclaimer, the term of this patent is extended or adjusted under 35 U.S.C. 154(b) by 744 days.

(21) Appl. No.: 15/960,175

(22) Filed: Apr. 23, 2018

(65) Prior Publication Data

US 2019/0326280 A1    Oct. 24, 2019

(51) Int. Cl.
*H01L 27/07*    (2006.01)
*H01L 27/06*    (2006.01)
(Continued)

(52) U.S. Cl.
CPC ...... *H01L 27/0727* (2013.01); *H01L 27/0605* (2013.01); *H01L 29/42316* (2013.01);
(Continued)

(58) Field of Classification Search
CPC ............ H01L 27/0727; H01L 27/0605; H01L 29/42316; H01L 29/7787; H03K 17/6871
See application file for complete search history.

(56) References Cited

U.S. PATENT DOCUMENTS

| 7,164,589 B1 | 1/2007 | Soldano et al. |
| 7,595,680 B2 | 9/2009 | Morita et al. |

(Continued)

FOREIGN PATENT DOCUMENTS

| CN | 102640288 A | 8/2012 |
| CN | 105871365 A | 8/2016 |

(Continued)

OTHER PUBLICATIONS

Kennith, Kin Leong, "Bidirectional Switch with Passive Electrical Network for Substrate Potential Stabilization", U.S. Appl. No. 15/683,217, filed Aug. 22, 2017.

(Continued)

*Primary Examiner* — Ryan Johnson
*Assistant Examiner* — Colleen J O Toole
(74) *Attorney, Agent, or Firm* — Murphy, Bilak & Homiller, PLLC

(57) ABSTRACT

A semiconductor device includes a main bi-directional switch formed on a semiconductor substrate and having first and second gates, a first source electrically connected to a first voltage terminal, a second source electrically connected to a second voltage terminal, and a common drain. The semiconductor device further includes a discharge circuit having a plurality of individual transistors or an auxiliary bi-directional switch monolithically integrated with the main bi-directional switch and connected in a common source configuration to the semiconductor substrate. The plurality of individual transistors or the auxiliary bi-directional switch includes a first drain connected to the first source of the main bi-directional switch, a second drain connected to the second source of the main bi-directional switch, and first and second gates each decoupled from gate drive circuitry so that the first and the second gates are (Continued)

controlled at least passively and based on a state of the main bi-directional switch.

22 Claims, 23 Drawing Sheets

(51) Int. Cl.
*H01L 29/423* (2006.01)
*H01L 29/778* (2006.01)
*H03K 17/687* (2006.01)
*H01L 29/20* (2006.01)

(52) U.S. Cl.
CPC ..... *H01L 29/7787* (2013.01); *H03K 17/6871* (2013.01); *H01L 29/2003* (2013.01)

(56) References Cited

U.S. PATENT DOCUMENTS

| | | | |
|---|---|---|---|
| 7,852,137 | B2 | 12/2010 | Machida et al. |
| 7,868,353 | B2 | 1/2011 | Machida et al. |
| 7,875,907 | B2* | 1/2011 | Honea ............... H01L 27/0605 257/192 |
| 8,344,424 | B2 | 1/2013 | Suh et al. |
| 8,604,512 | B2 | 12/2013 | Morita |
| 8,664,690 | B1 | 3/2014 | Chen et al. |
| 9,443,845 | B1 | 9/2016 | Stafanov et al. |
| 10,224,924 | B1 | 3/2019 | Leong |
| 10,979,032 | B1 | 4/2021 | Leong et al. |
| 11,088,688 | B2 | 8/2021 | Pala |
| 2006/0145744 | A1* | 7/2006 | Diorio ...................... G06F 1/10 327/276 |
| 2009/0167411 | A1 | 7/2009 | Machida et al. |
| 2009/0206363 | A1 | 8/2009 | Machida et al. |
| 2010/0155775 | A1 | 6/2010 | Gauthier et al. |
| 2012/0217542 | A1 | 8/2012 | Morita |
| 2012/0287688 | A1 | 11/2012 | Fornage et al. |
| 2014/0145208 | A1 | 5/2014 | Rose et al. |
| 2014/0197448 | A1 | 7/2014 | Galy et al. |
| 2014/0203289 | A1 | 7/2014 | Liu et al. |
| 2014/0264431 | A1 | 9/2014 | Lal |
| 2014/0374766 | A1* | 12/2014 | Bahl ................. H01L 27/0629 257/76 |
| 2015/0043116 | A1 | 2/2015 | Weyers et al. |
| 2015/0180469 | A1 | 6/2015 | Kim |
| 2015/0256163 | A1 | 9/2015 | Weis |
| 2016/0079233 | A1 | 3/2016 | Deboy et al. |
| 2016/0322485 | A1 | 11/2016 | Padmanabhan et al. |
| 2017/0062419 | A1 | 3/2017 | Rose et al. |
| 2017/0103978 | A1* | 4/2017 | Prechtl ................ H01L 21/4825 |
| 2017/0338809 | A1 | 11/2017 | Stefanov et al. |
| 2020/0098745 | A1 | 3/2020 | Roig-Guitart |
| 2020/0287536 | A1 | 9/2020 | Udrea et al. |

FOREIGN PATENT DOCUMENTS

| | | |
|---|---|---|
| EP | 3249815 A1 | 11/2017 |
| TW | 200541073 A | 12/2005 |
| WO | 2005002054 A1 | 1/2005 |
| WO | 2017159559 A1 | 9/2017 |
| WO | 2021206065 A1 | 10/2021 |

OTHER PUBLICATIONS

Chen, Ren-Yi, et al., "Study and Implementation of a Current-Fed Full-Bridge Boost DC-DC Converter With Zero-Current Switching for High-Voltage Applications", IEEE Transactions on Industry Applications, vol. 44, No. 4, Jul./Aug. 2008, 1218-1226.

Chowdhury, Dilder, "GaN FETs: Why cascode?", Sep. 30, 2020, pp. 1-6.

Friedli, Thomas, et al., Design and Performance of a 200-kHz All-SiC JFET Current DC-Link Back-to-Back Converter, IEEE Transactions on Industry Applications, vol. 45, No. 5, Sep./Oct. 2009, 1868-1878.

Huber, Jonas Emanuel, "Automatic Reverse Blocking Bidirectional Switch", U.S. Appl. No. 17/542,660, filed Dec. 6, 2021.

Kolar, J.W., et al., "Novel Three-Phase AC-DC-AC Sparse Matrix Converter", IEEE, 2002, 777-787.

Lindemann, A., "A New IGBT with Reverse Blocking Capability", Entwurf fuer EPE Conference, European Conference on Power Electronics and Applications, Graz, Austria, 2001, Posted to Internet on Sep. 11, 2014, 2001, pp. 1-7.

Siemaszko, Daniel, et al., "Active Self-Switching Methods for Emerging Monolithic Bidirectional Switches Applied to Diode-Less Converters", 2009 13th European Conference on Power Electronics and Applications, Sep. 8-10, 2009, 1-9.

Soeiro, Thiago B., et al., "Three-Phase Modular Multilevel Current Source Rectifiers for Electric Vehicle Battery Charging Systems", IEEE, 2013, 623-629.

Haehre, K., et al., "Switching Speed-Control of an Optimized Capacitor-Clamped Normally-On Silicon Carbide JFET Cascode", 15th International Power Electronics and Motion Control Conference, EPE-PEMC 2012 ECCE Europe, Novi Sad, Serbia, Sep. 4, 2012, pp. DSla.11-1-DSla.11-5.

Li, Xueqing, et al., "Medium Voltage Power Module Based on SiC JFETs", IEEE Applied Power Electronics Conference and Exposition (APEC), Mar. 26, 2017, pp. 3033-3037.

* cited by examiner

US 11,862,630 B2

SEMICONDUCTOR DEVICE HAVING A BIDIRECTIONAL SWITCH AND DISCHARGE CIRCUIT

BACKGROUND

Two separate gates with a common drain in a monolithic device is a popular configuration for realizing a bi-directional switch. The monolithic device is typically implemented in a common substrate, where each of the two switches has its own gate driver. The common drain configuration has a source at either end of the monolithic device, meaning that a source connection to the substrate is not an option for the bidirectional switch. If the substrate is kept floating and one of the two sources is biased at a high voltage, that source in conjunction with the adjacent gate acts as an extended drain and thus follows the high potential. The substrate must be kept as close to ground potential during on-state as possible for stable bi-directional device operation. Conventionally, two back-to-back diodes are integrated with their anodes connected to the substrate and each cathode connected to either end of the sources. However, such a back-to-back diode implementation does not hold the substrate voltage to the desired (close to 0V) voltage during the on-state of the bi-directional switch and thus degrades device performance. Instead, the substrate experiences a large negative potential because negative charge stored in the substrate during the off-state of the bi-directional switch is confined to the substrate which is in the middle point of the back-to-back diode. This confinement is induced by either diode in the back-to-back diodes initially forward-biased during the off-state of the bi-directional switch but changed to the blocking mode when the bi-directional device switches from the off-state to the on-state. Hence, there is a need for a more effective monolithic solution for providing a discharge path for the substrate during the off-to-on switching of a bi-directional switch.

SUMMARY

According to an embodiment of a semiconductor device, the semiconductor device comprises a main bi-directional switch and a discharge circuit. The main bi-directional switch is formed on a semiconductor substrate and comprises first and second gates, a first source electrically connected to a first voltage terminal, a second source electrically connected to a second voltage terminal, and a common drain. The discharge circuit comprises a plurality of individual transistors or an auxiliary bi-directional switch monolithically integrated with the main bi-directional switch and connected in a common source configuration to the semiconductor substrate. The plurality of individual transistors or the auxiliary bi-directional switch comprises a first electrode connected to the first source of the main bi-directional switch, a second electrode connected to the second source of the main bi-directional switch, and first and second gates each decoupled from gate drive circuitry so that the first and the second gates are controlled at least passively and based on a state of the main bi-directional switch.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide control transistors connected in a common electrode (e.g., source) configuration or implemented as a common electrode (e.g., source) bi-directional switch monolithically integrated with a main bi-directional switch. The monolithically integrated control transistors are configured to hold the semiconductor substrate of the bi-directional switch at a desired voltage during the on-state of the bi-directional switch, functioning as a discharge circuit that provides a discharge path for the semiconductor substrate. The gates of the monolithically integrated control transistors can be connected together and floating, disconnected from one another and each floating, connected together and connected to the sources of the bi-directional switch through respective diodes, or disconnected from each other and connected to the sources of the bi-directional switch through respective diodes. In each case, no additional gate drivers, auxiliary supplies or control components are required to ensure proper operation of the monolithically integrated control transistors, thus providing a fundamentally passive solution for holding the semiconductor substrate of the bi-directional switch at a desired voltage during the on-state of the bi-directional switch.

While the discharge circuit described herein may be monolithically integrated with the main bi-directional switch, the discharge circuit instead may be external to (i.e. not integrated with) the main bi-directional switch. In this case, the electrical connections described herein between the discharge circuit and the main bi-directional switch may be formed through respective terminals of separate dies and/or packages which include the discharge circuit and the main bi-directional switch. Die-to-die, die-to-package, and package-to-package terminal connections are well known in the semiconductor device arts and can be implemented e.g. by wire bonds, metal clips, metal ribbons, solder bumps, die stacking, package stacking, etc., and hence no further explanation is given herein to such terminal connections.

Figure 1:
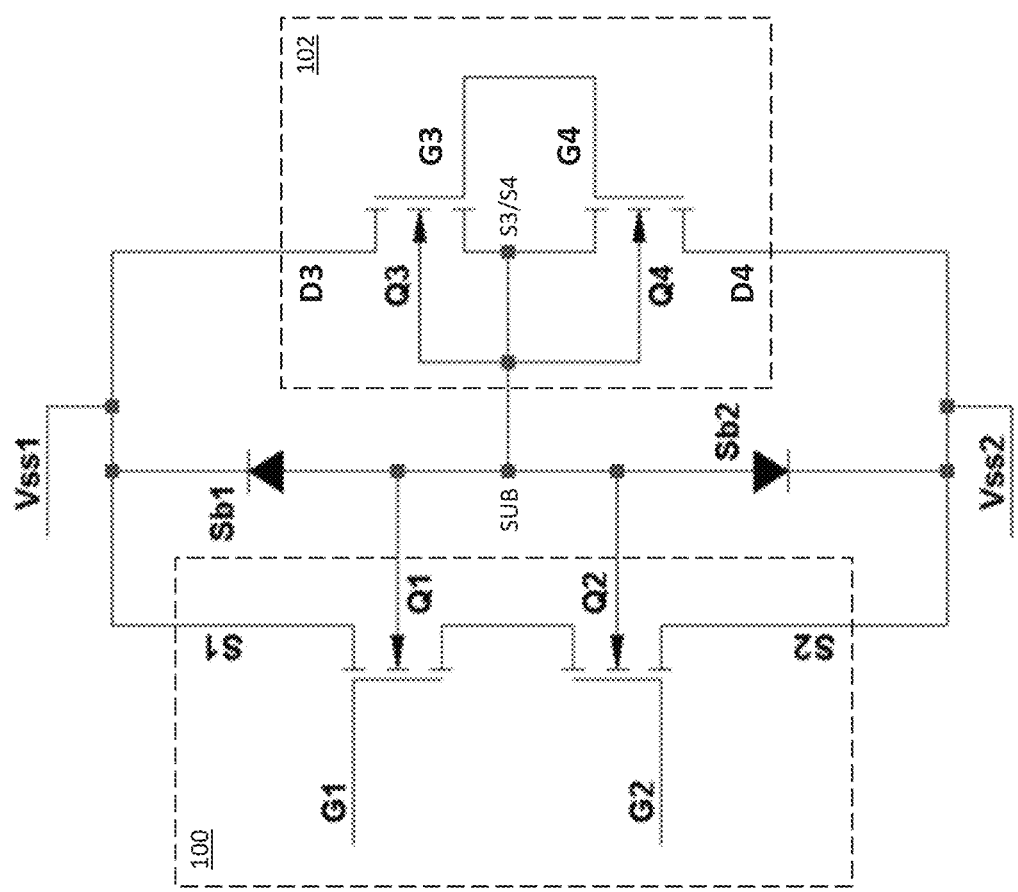
FIGS. 1 and 2 illustrate respective circuit schematics of embodiments of a semiconductor device that includes a main bi-directional switch and a discharge circuit for providing a substrate discharge path during the off-to-on switching of the bi-directional switch.

FIG. 1 illustrates a circuit schematic of an embodiment of a semiconductor device that includes a main bi-directional switch 100 and a discharge circuit 102 for providing a substrate discharge path during off-to-on switching of the bi-directional switch 100. The main bi-directional switch 100 is formed on a semiconductor substrate which is schematically represented by the node labeled 'SUB' in FIG. 1. The main bi-directional switch 100 has first and second gates G1, G2, first and second sources S1, S2, and a common drain. The first source S1 of the main bi-directional switch 100 is electrically connected to a first voltage terminal Vss1. The second source S2 of the main bi-directional switch 100 is electrically connected to a second voltage terminal Vss2.

The main bi-directional switch 100 has four primary operational states: OFF/OFF in which both gates G1, G2 of the main bi-directional switch 100 are off; ON/ON in which both gates G1, G2 of the main bi-directional switch 100 are on; ON/OFF in which the first gate G1 of the main bi-directional switch 100 is on and the second gate G2 of the main bi-directional switch 100 is off; and OFF/ON in which the first gate G1 of the main bi-directional switch 100 is off and the second gate G2 of the main bi-directional switch 100 is on. The typical operation of a bi-directional switch includes transitioning from ON/OFF to ON/ON, and from OFF/ON to ON/ON. The current flow direction depends on the polarity across the first and second voltage terminals Vss1, Vss2. The current flow direction can be reversed by changing the polarity.

The main bi-directional switch 100 is schematically represented by main transistors Q1 and Q2 in FIG. 1. Main transistors Q1 and Q2 share a common drain, and have sources S1, S2 at opposite ends of the main bi-directional switch 100 in the case of a lateral device. According to the embodiment shown in FIG. 1, first and second substrate diodes Sb1 and Sb2 are monolithically integrated with the main bi-directional switch 100. The anode of the first substrate diode Sb1 and the anode of the second substrate diode Sb2 are connected to the semiconductor substrate. The cathode of the first substrate diode Sb1 is connected to the first source S1 of the main bi-directional switch 100, and the cathode of the second substrate diode Sb2 is connected to the second source S2 of the main bi-directional switch 100.

The discharge circuit 102 that provides a discharge path for the semiconductor substrate during the off-to-on switching of the main bi-directional switch 100 includes a plurality of individual transistors or an auxiliary bi-directional switch monolithically integrated with the main bi-directional switch 100. For example, a pair of individual transistors or the auxiliary bi-directional switch is schematically represented by control transistors Q3 and Q4 in FIG. 1. Control transistors Q3 and Q4 are connected to the semiconductor substrate in a common electrode (e.g., source) configuration. More particularly, the individual transistors or the auxiliary bi-directional switch represented by control transistors Q3 and Q4 in FIG. 1 includes a first electrode (e.g., drain) D3 connected to the first source S1 of the main bi-directional switch 100, a second electrode (e.g., drain) D4 connected to the second source S2 of the main bi-directional switch 100, a common electrode (e.g., source) S3/S4 connected to the semiconductor substrate, and first and second gates G3, G4 each decoupled from gate drive circuitry. Gates G3 and G4 are tied together and floating. Since the first and second gates G3, G4 of the control transistors Q3 and Q4 are each decoupled from gate drive circuitry, the first and the second gates G3, G4 of the discharge circuit 102 are controlled at least passively and based on the state of the main bi-directional switch 100.

In the off-state (ON/OFF or OFF/ON), the gates G1 and G2 of the main bi-directional switches 100 are on and off, respectively, and the main bi-directional switch 100 is in a blocking state. Under this condition, a relatively high voltage is applied at the first voltage terminal Vss1, control transistors Q3 and Q4 are not conducting, and most of the source voltage appears across main transistor Q2 and control transistor Q3. If instead the source voltage is applied at the second voltage terminal Vss2, control transistors Q3 and Q4 are still not conducting and most of the source voltage appears across main transistor Q1 and control transistor Q4.

When the main bi-directional switch 100 transitions from the off-state (ON/OFF or OFF/ON) to the on-state (ON/ON), a current channel forms in the main bi-directional switch 100 and practically no voltage drop occurs across the switch 100. Some of the stored charge in main transistors Q1 and Q2 and control transistor Q3 or Q4 discharges through main transistors Q1 and Q2. In addition, the other stored charge discharges through control transistors Q3 and Q4 since both are on instantaneously or almost instantaneously during the off-to-on switching. For example, when the source voltage of the first voltage terminal Vss1 changes from high positive voltage to low positive voltage, in other words, when Q2 switches from off to on and Q1 remains on, the gates G3, G4 of control transistors Q3 and Q4 become more positive with respect to their common source terminal S3/S4 which causes control transistors Q3 and Q4 to turn on, thereby providing a discharge path for the stored charge in the semiconductor substrate and de-biasing the substrate to 0V or close to 0V.

As previously explained herein, the gates G3, G4 of the control transistors Q3, Q4 may be connected together and floating or disconnected from one another and each floating. The state of the gates G3, G4 of the control transistors Q3, Q4 is based on the state of the main bi-directional switch 100. FIG. 1 illustrates the embodiment in which the gates G3, G4 of the control transistors Q3, Q4 are connected together and floating.

Figure 2:
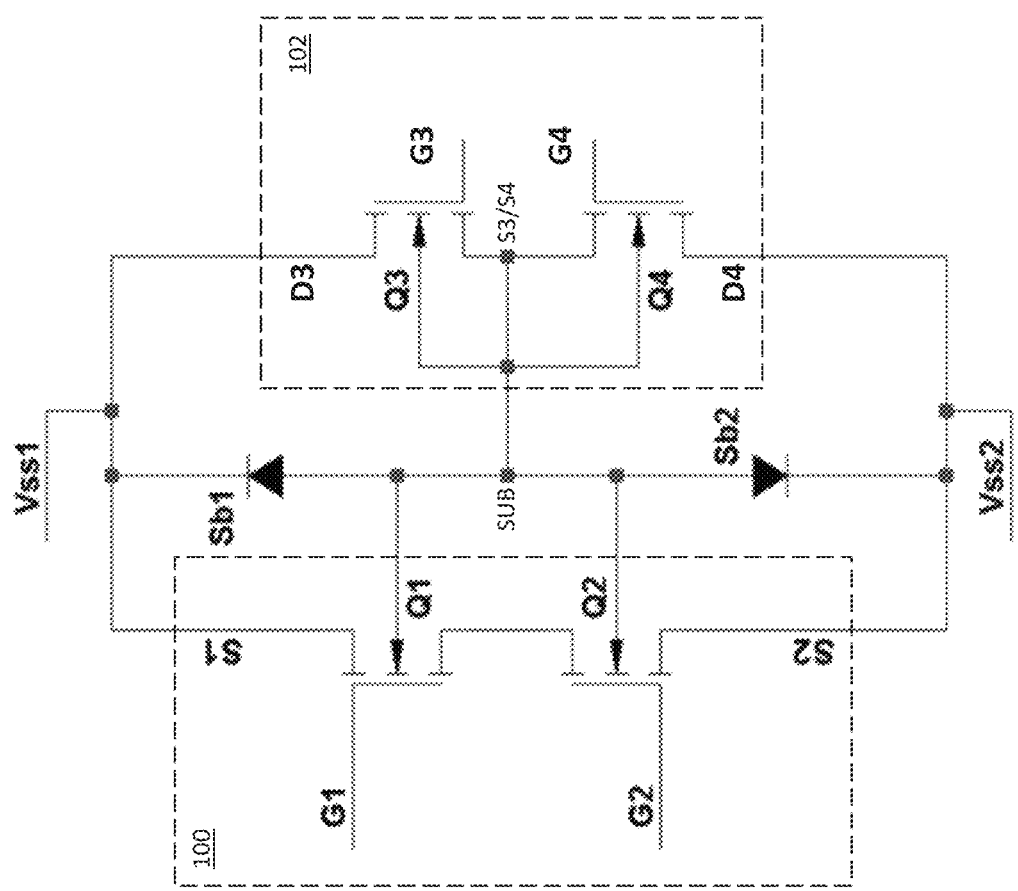

FIG. 2 illustrates a circuit schematic of another embodiment of the semiconductor device in which the gates G3, G4 of the control transistors Q3, Q4 that form the individual transistors or the auxiliary bi-directional switch of the discharge circuit 102 are disconnected from one another and each floating.

Figure 3:
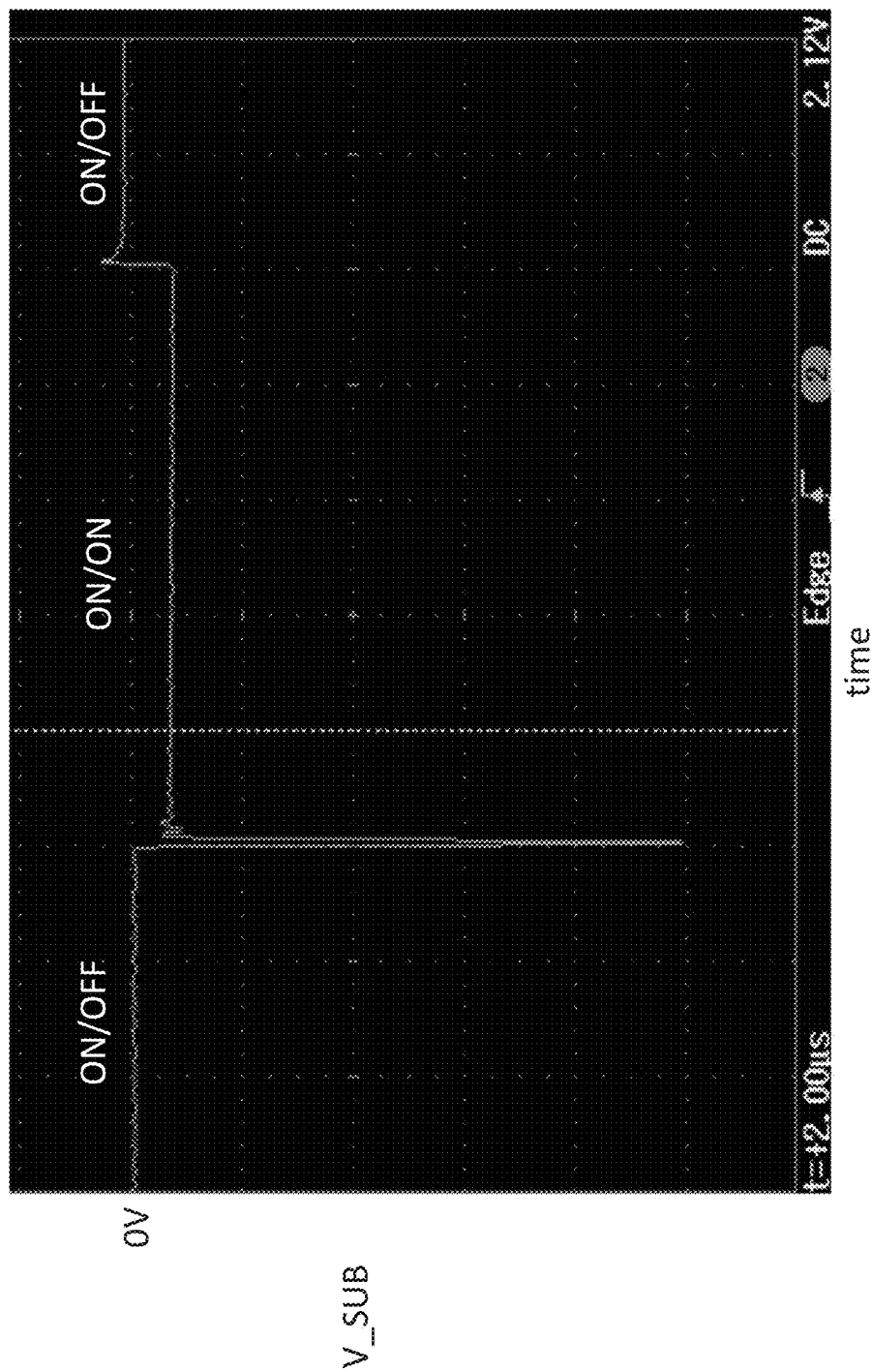
FIG. 3 illustrates the dynamic behavior of the semiconductor substrate of the main bi-directional switch for the discharge circuit gate configurations shown in FIGS. 1 and 2.

FIG. 3 illustrates the dynamic behavior of the semiconductor substrate potential (V_SUB) of the main bi-directional switch 100 for the discharge circuit gate configurations shown in FIGS. 1 and 2. Without the discharge circuit 102, the substrate potential would swing to a high negative voltage, going from OFF/ON state (or ON/OFF—either G1 or G2 ON and the other gate is OFF) to ON/ON state (both G1 and G2 are ON). The discharge circuit 102 shown in FIGS. 1 and 2 has a common electrode (e.g., source) connection to the semiconductor substrate which controls reliably the voltage on the substrate together with the back-to-back diodes during the operation of the main bi-directional switches. In the case when gate G1 is ON and gate G2 is OFF, a high voltage (e.g. 200 V) applied at the first voltage terminal Vss1 is shared between substrate diode Sb1 and control transistor Q3 with very small drop across substrate diode Sb2, which keeps the semiconductor substrate at a lower voltage. As gate G2 is switched ON while keeping gate G1 ON, the control transistors Q3 and Q4 in FIGS. 1 and 2 each become conducting since the voltage of the common electrode (e.g., source) is sufficiently highly negative compared to that of their gates to turn on the control transistors Q3 and Q4, pulling the semiconductor substrate down to the lower source potentials of the first and/or second sources S1, S2 as the negative charge stored in the substrate is discharged through control transistors Q3, Q4.

During the nanosecond interval where the control transistors Q3 and Q4 switch from OFF to ON, the semiconductor substrate potential tries to go negative, but quickly recovers to the desired voltage or close to 0V through the discharge path of control transistors Q3 and/or Q4. While the semiconductor substrate experiences a negative voltage during this short interval (e.g. about 100 ns or less), the negative voltage excursion is significantly shorter than what the substrate would have otherwise experienced if the discharge circuit 102 were omitted. In the case without the discharge circuit, the substrate would be biased negatively at about half the full source voltage and the substrate diodes Sb1 and Sb2 would remain in a blocking state, preventing the substrate from fully discharging since there is no discharge path.

With the discharge circuit 102 monolithically integrated with the main bi-directional switch 100, both control transistors Q3 and Q4 act like diodes during the off-state (OFF/OFF, OFF/ON and ON/OFF). The potential of the semiconductor substrate for the common drain main bi-directional switch 100 tries to go negative as the bi-directional switch 100 transitions from the ON/OFF state or the OFF/ON state to ON/ON, but the control transistors Q3 and Q4 of the discharge circuit 102 respond almost immediately and discharge the charge stored in the substrate through the control transistors Q3 and/or Q4.

In some embodiments in which the main bi-directional switch 100 and the discharge circuit 102 are monolithically integrated in GaN technology, it can take approximately about 90 ns (about 11 MHz) or less for the control transistors Q3 and Q4 to switch ON and discharge the charge stored in the substrate through control transistors Q3 and Q4. One voltage terminal (e.g., Vss1) can be a higher potential with respect to the other terminal (e.g., Vss2) and vice-versa. In each case, the discharge circuit 102 is configured to automatically discharge the charge stored at the semiconductor substrate to the sources S1 and S2 responsive to the main bi-directional switch 100 transitioning from the ON/OFF state or the OFF/ON state to the ON/ON state.

In the embodiments shown in FIGS. 1 and 2, the gates G3, G4 of control transistors Q3, Q4 that form the individual transistors or the auxiliary bi-directional switch of the discharge circuit 102 are floating and self-defined based on the floating potentials of the substrate and the control transistor gate.

Figure 4:
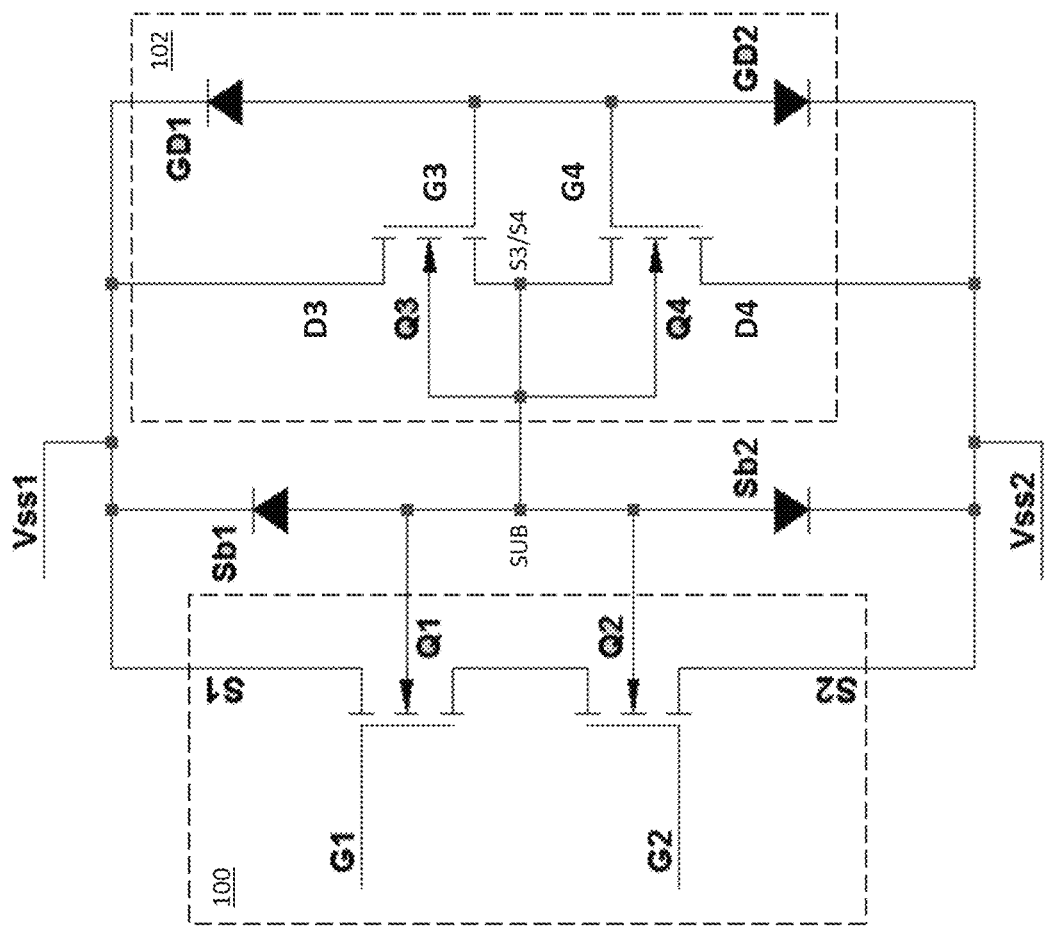
FIG. 4 illustrates a circuit schematic of an embodiment of a semiconductor device that includes a main bi-directional switch and a discharge circuit for providing a substrate discharge path during the off-to-on switching of the bi-directional switch.

FIG. 4 illustrates a circuit schematic of yet another embodiment of a semiconductor device that includes the main bi-directional switch 100 and the discharge circuit 102. The embodiment shown in FIG. 4 is similar to the embodiments shown in FIGS. 1 and 2. Different, however, a first auxiliary diode GD1 and a second auxiliary diode GD2 are also monolithically integrated with the main bi-directional switch 100. The anode of the first auxiliary diode GD1 is connected to the gate G3 of control transistor Q3 of the discharge circuit 102. The cathode of the first auxiliary diode GD1 is connected to the first source S1 of the main bi-directional switch 100. The anode of the second auxiliary diode GD2 is similarly connected to the gate G4 of control transistor Q4 of the discharge circuit 102. The cathode of the second auxiliary diode GD2 is connected to the second source S2 of the main bi-directional switch 100.

Further according to this embodiment, the gate G3 of control transistor Q3 of the discharge circuit 102 is interposed between the first drain D3 and the common source S3/S4 of the discharge circuit 102. The gate G4 of control transistor Q4 of the discharge circuit 102 is interposed between the common source S3/S4 and the second drain D4 of the discharge circuit 102. With the configuration shown in FIG. 4, the gates G3, G4 of the control transistors Q3, Q4 are connected respectively to the first and second voltage terminals Vss1 and Vss2 through the corresponding auxiliary diodes GD1 and GD2. The auxiliary diodes GD1 and GD2 can be simple diodes or FETs connected in diode mode (gate-source shorted together), as explained in more detail later herein. Similar to the embodiments shown in FIGS. 1 and 2, there no additional gate drivers, auxiliary supplies or control components are required for the embodiment shown in FIG. 4.

Figure 5:
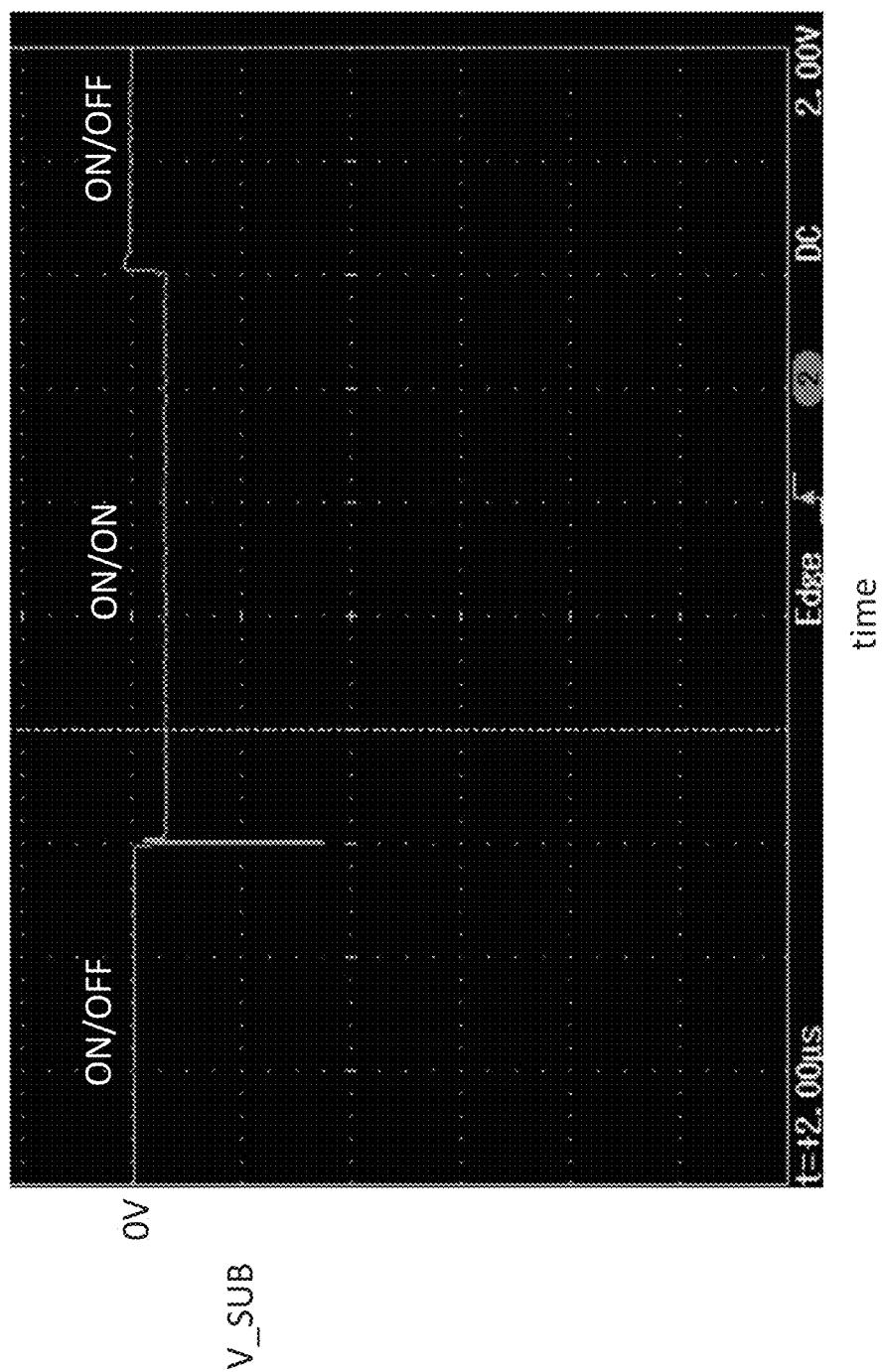
FIG. 5 illustrates the dynamic behavior of the semiconductor substrate of the main bi-directional switch for the discharge circuit gate configuration shown in FIG. 4.

FIG. 5 illustrates the dynamic behavior of the semiconductor substrate potential (V_SUB) of the main bi-directional switch 100 for the discharge circuit gate configuration shown in FIG. 4. When gate G1 is ON, gate G2 is OFF and a relatively high voltage is applied at the first voltage terminal Vss1, the high voltage being shared between substrate diode Sb1, control transistor Q3 and auxiliary diode GD1. A very low voltage occurs across control transistor Q4, substrate diode Sb2 and auxiliary diode GD2. When gate G2 is turned ON, control transistors Q3 and Q4 with auxiliary diodes GD1 and GD2 ensure a momentary or almost momentary short or near short between the semiconductor substrate and the second source S2, thus leading to discharging and keeping the substrate stable at lower potential closer to 0V. During the off-to-on switching, the configurations shown in FIGS. 1, 2 and 4 each have a characteristic signature of a brief negative voltage spike at the semiconductor substrate as shown in FIGS. 3 and 5, which occurs momentarily before the semiconductor substrate potential of the main bi-directional switch 100 stabilizes to a small value. As explained above, the negative voltage excursion experienced by the semiconductor substrate is significantly shorter than what the substrate would have otherwise experienced if the discharge circuit 102 were omitted.

Figure 6:
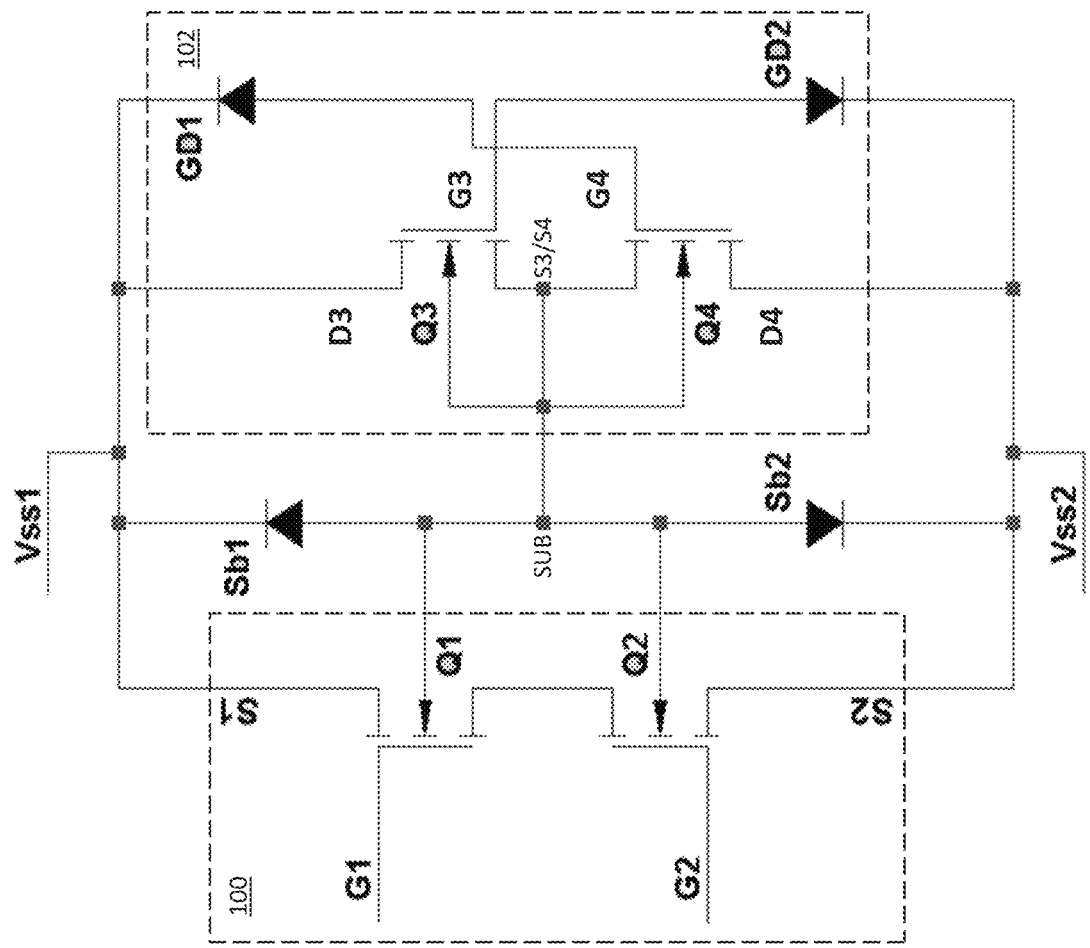
FIGS. 6 and 7 illustrate respective circuit schematics of embodiments of a semiconductor device that includes a main bi-directional switch and a discharge circuit for providing a substrate discharge path during the off-to-on switching of the bi-directional switch.

FIG. 6 illustrates a circuit schematic of still another embodiment of a semiconductor device that includes the main bi-directional switch 100 and the discharge circuit 102. The embodiment shown in FIG. 6 is similar to the embodiment shown in FIG. 4. Different, however, the anode connections of the auxiliary diodes GD1, GD2 are reversed. That is, the anode of the first auxiliary diode GD1 is connected to the gate G4 of control transistor Q4 of the discharge circuit 102 instead of the gate G3 of control transistor Q3. The anode of the second auxiliary diode GD2 is connected to the gate G3 of control transistor Q3 of the discharge circuit 102 instead of the gate G4 of control transistor Q4. It is believed that the auxiliary diode configuration shown in FIG. 6 eliminates or significantly reduces the characteristic signature of a brief negative voltage spike at the semiconductor substrate before the semiconductor substrate of the main bi-directional switch 100 stabilizes to a small value.

Figure 7:
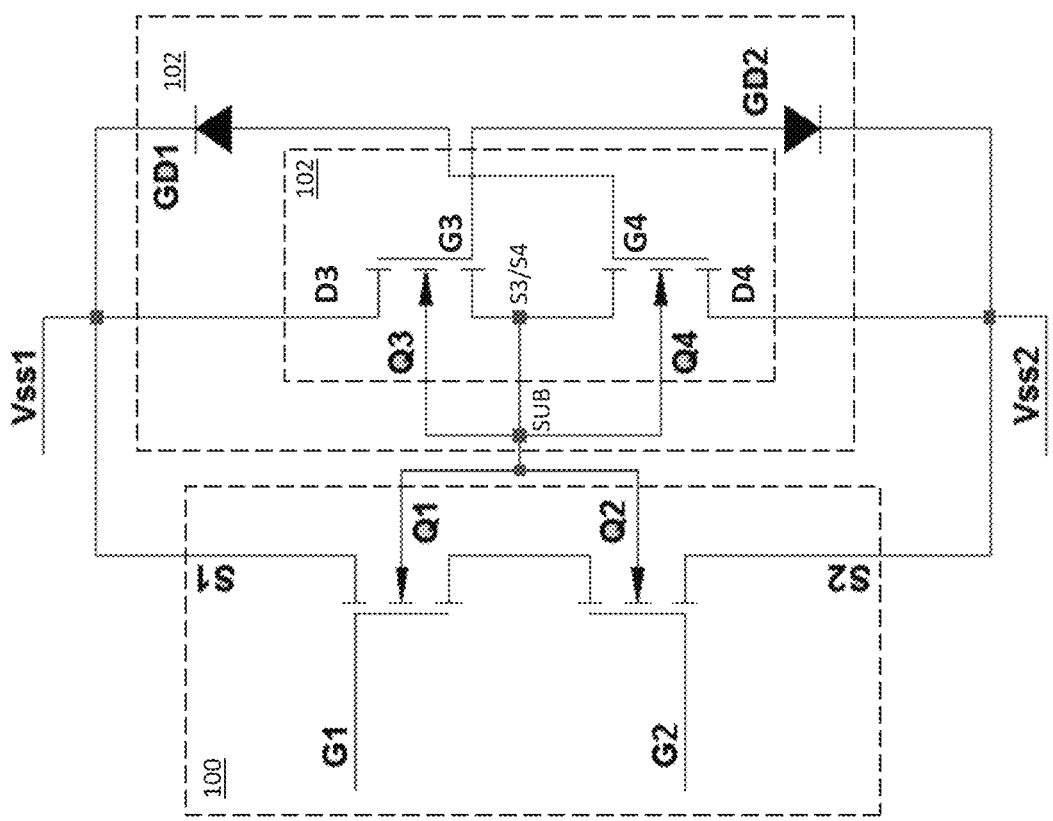

FIG. 7 illustrates a circuit schematic of another embodiment of a semiconductor device that includes the main bi-directional switch 100 and the discharge circuit 102. The embodiment shown in FIG. 7 is similar to the embodiment shown in FIG. 6. Different, however, the substrate diodes Sb1 and Sb2 are omitted. According to this embodiment, the semiconductor device that includes the discharge circuit 102 monolithically integrated with the main bi-directional switch 100 is devoid of diode connections between the first source S1 of the main bi-directional switch 100 and the semiconductor substrate, and between the second source S2 of the main bi-directional switch 100 and the semiconductor substrate.

Figure 8:
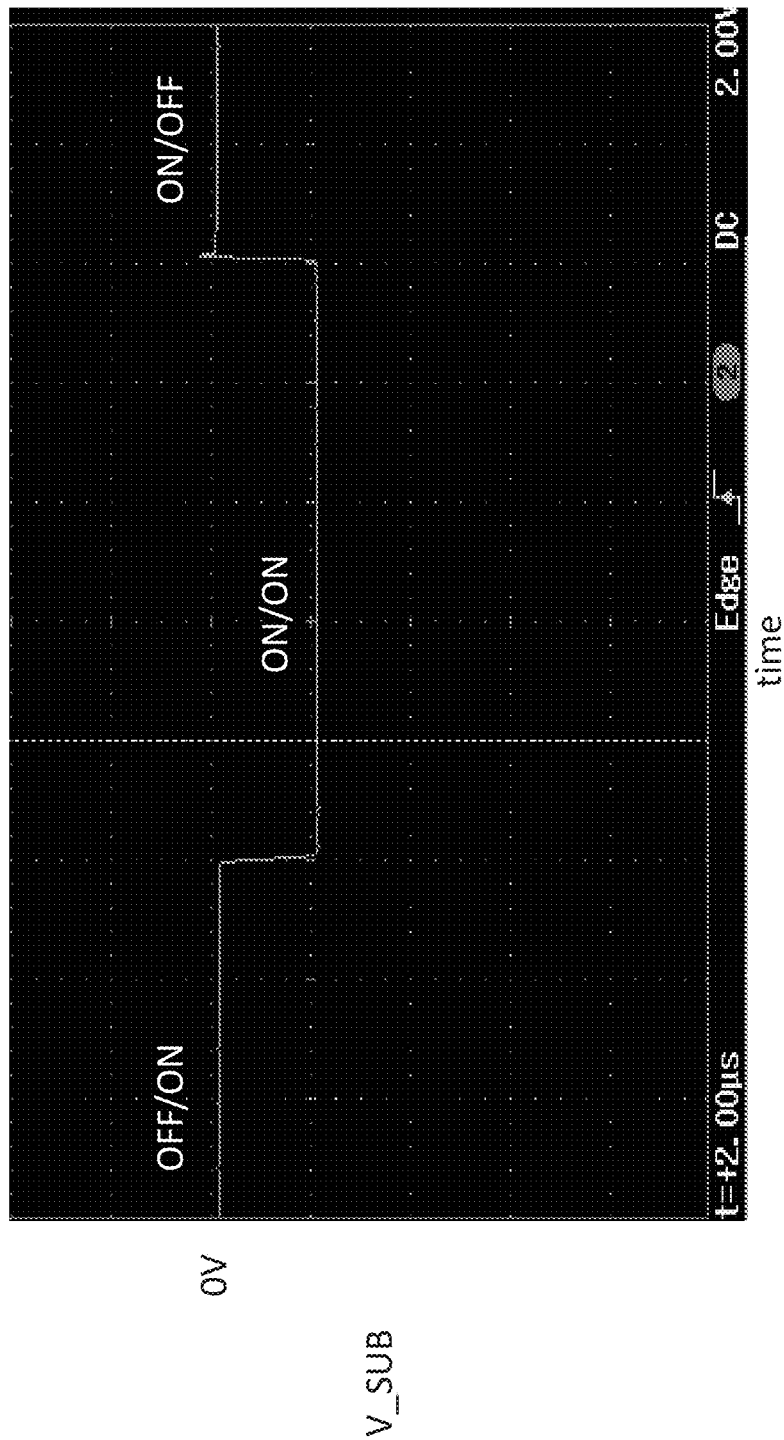
FIG. 8 illustrates the dynamic behavior of the semiconductor substrate of the main bi-directional switch for the discharge circuit gate configurations shown in FIGS. 6 and 7.

FIG. 8 illustrates the dynamic behavior of the semiconductor substrate potential (V_SUB) of the main bi-directional switch 100 for the discharge circuit gate configurations shown in FIGS. 6 and 7. The dynamic characteristic behavior of the semiconductor substrate with the discharge circuit control transistors Q3, Q4 can be suppressed without impacting the stability of the semiconductor substrate. When voltage terminal Vss1 is at high voltage, the auxiliary diode GD1 is in series with control transistor Q4 and the auxiliary diode GD2 is in series with control transistor Q3. Control transistors Q3 and/or Q4 turn on for a short time during the off-to-on switching. With this configuration, the negative voltage spike at the semiconductor substrate at the beginning of the turn ON of the main bi-directional switch 100 is effectively eliminated.

In each of the circuit configurations shown in FIGS. 1, 2, 4, 6 and 7, the discharge circuit 102 is monolithically integrated with the main bi-directional switch 100 of the semiconductor device. The discharge circuit 102 is connected in a common source configuration to the semiconductor substrate of the main bi-directional switch 100. The gates G3, G4 of the monolithically integrated control transistors Q3, Q4 can be connected together and floating, disconnected from one another and each floating, connected together and connected to the sources of the main bi-directional switch 100 through respective diodes, or disconnected from each other and connected to the sources of the main bi-directional switch 100 through respective diodes. Described next are various device embodiments of the main bi-directional switch 100 and monolithically integrated discharge circuit 102.

Figure 9:
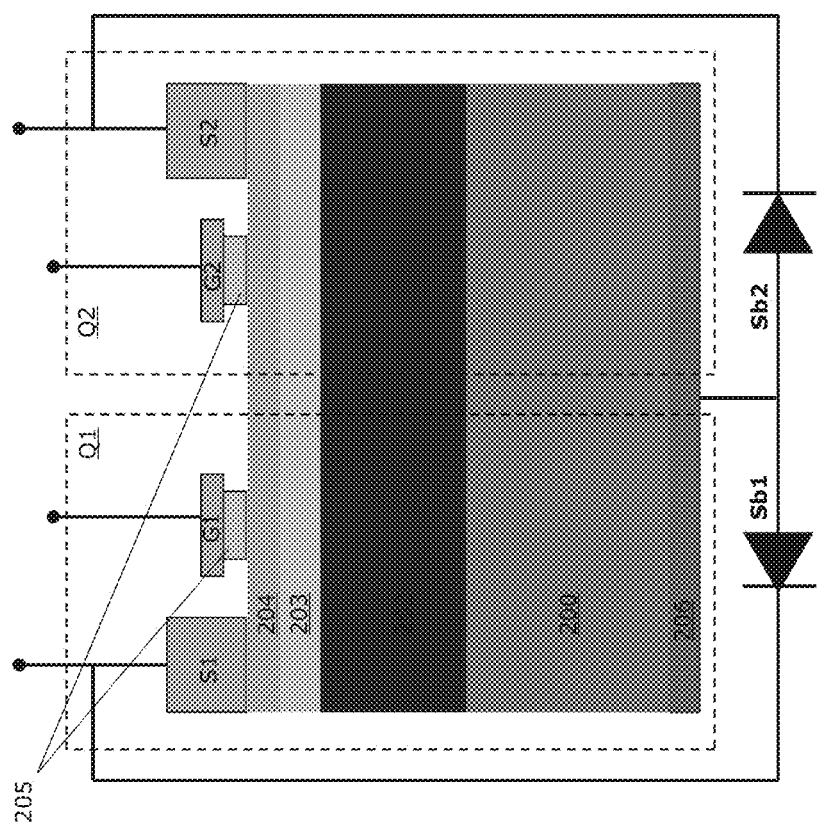
FIGS. 9, 10A-10B, 11A-11B, 12, 13A-13B, 14A-14B, 15, 16, 17A-17B, 18, 19 and 20 illustrate respective cross-sectional views of different embodiments of a compound semiconductor device implemented in a III-nitride technology and including a main bi-directional switch and a discharge circuit for providing a substrate discharge path during the off-to-on switching of the bi-directional switch.

FIG. 9 illustrates a cross-sectional view of an embodiment of the main bi-directional switch 100, implemented as part of a compound semiconductor device in III-nitride technology such as GaN high electron mobility transistor (HEMT). The main bi-directional switch 100 is formed on a semiconductor substrate 200 such as a Si substrate or one or more epitaxially-grown or implanted Si layers on Si substrate. A III-nitride buffer region 202 (e.g., GaN) is formed over the semiconductor substrate 200, a III-nitride channel region 203 (e.g., GaN) is formed over the III-nitride buffer region 202, and a III-nitride barrier region 204 (e.g., AlGaN) is formed over the III-nitride channel region 203. The HEMT can be a normally-on device in which the channel is uninterrupted along the gate absent a gate voltage, or a normally-off device in which the channel is interrupted along the gate absent a gate voltage. For example, in the case of a normally-off device, the HEMT may include a p-doped III-nitride layer 205 between the gates G1, G2 and the underlying III-nitride barrier region 204. In the case of a normally-on device, the p-doped III-nitride layer 205 between the gates G1, G2 and the underlying III-nitride barrier region 204 may be omitted.

The presence of polarization charges and strain effects in a GaN-based heterostructure body due to spontaneous and piezoelectric polarization yield a two-dimensional charge carrier gas in the heterostructure body characterized by very high carrier density and carrier mobility. This two-dimensional charge carrier gas, such as a 2DEG (two-dimensional electron gas) or 2DHG (two-dimensional hole gas), forms the conductive channel of the main bi-directional switch 100 near the interface between the III-nitride barrier 204, e.g., a GaN alloy barrier such as AlGaN, InAlGaN, InAlN, etc. and the III-nitride channel region 203 (e.g., GaN channel layer). A thin, e.g. 1-2 nm, AlN layer can be provided between the III-nitride channel region 203 and the GaN alloy barrier 204 to minimize alloy scattering and enhance 2DEG mobility. The III-nitride buffer, channel and barrier regions 202, 203, 204 can be manufactured on a semiconductor substrate 200 such as a Si, SiC or sapphire substrate, on which a nucleation (seed) layer such as an AlN layer can be formed for providing thermal and lattice matching to the III-nitride buffer region 202 and/or III-nitride channel region 203. The compound semiconductor device may also have AlInN/AlN/GaN barrier/spacer/channel layer/buffer layer structures. In general, the compound semiconductor device can be realized using any suitable III-nitride technology such as GaN that permits the formation of opposite polarity inversion regions due to piezoelectric effects.

The transistors labeled Q1 and Q2 in FIGS. 1, 2, 4, 6 and 7 represent the main bi-directional switch 100. Transistors Q1 and Q2 can be implemented as first and second gates G1, G2, first and second sources S1, S2, and a common drain formed in the III-nitride heterostructure body 202/203/204. The common drain is positioned between the gates G1, G2. When the high voltage is applied to source S1, the drain of the main bi-directional switch 100 is formed by gate G1 and source S1. Conversely, when the high voltage is applied to source S2, the drain of the main bi-directional switch 100 is formed by gate G2 and source S2. By spacing source S1 the same distance to gate G1 as source S2 is spaced to gate G2, the main bi-directional switch 100 is symmetric. FIG. 9 also schematically illustrates the substrate diodes Sb1, Sb2 shown in FIGS. 1, 2, 4 and 6. A substrate electrode 206 such as a backside metallization layer may be provided to form an ohmic connection with the backside of the substrate 200.

Figures 10A, 10B:
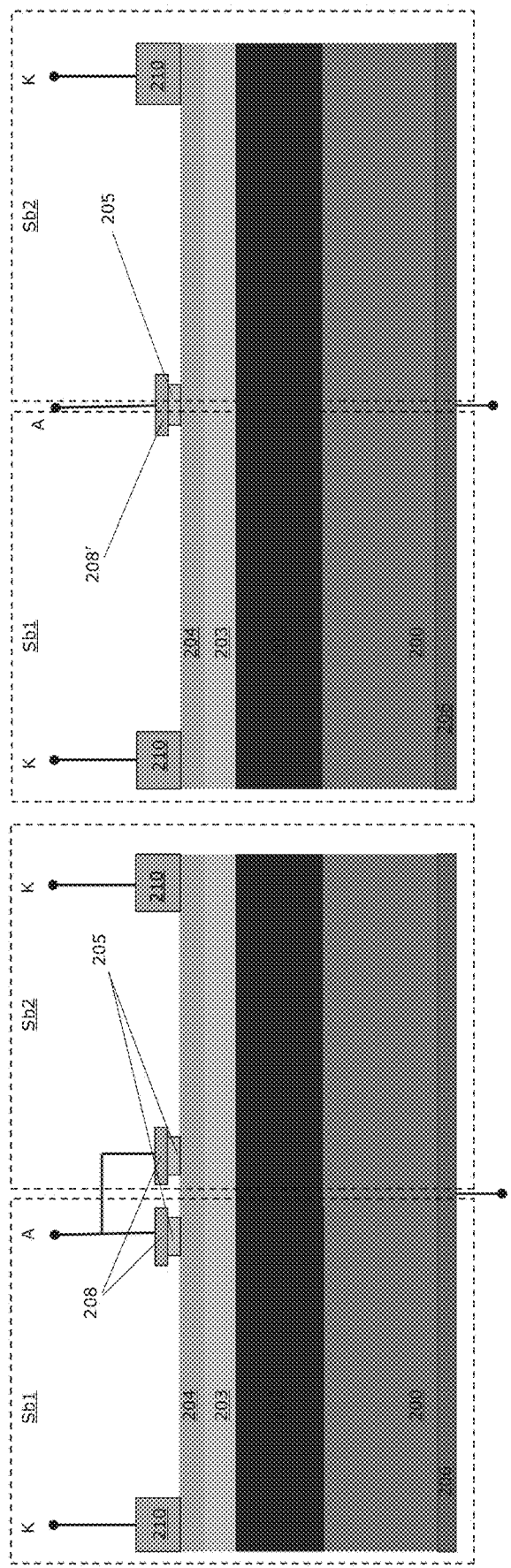

FIGS. 10A and 10B illustrate respective cross-sectional views of embodiments of the substrate diodes Sb1, Sb2 shown in FIGS. 1, 2, 4 and 6. The substrate diodes Sb1, Sb2 are monolithically integrated with the main bi-directional switch 100, which is out of view in FIGS. 10A and 10B. Each substrate diode Sb1, Sb2 can be a GaN diode that includes a p-doped region (e.g., pGaN) with an electrode 208 such as the anode (A), a two-dimensional electron gas (2DEG) and another electrode 210 such as the cathode (K). The 2DEG can be formed by spontaneous and piezoelectric polarization between the III-nitride channel region 203 and the III-nitride barrier region 204 in a diode region of the device. The p-doped regions on the III-nitride barrier region 204 can be formed by doping or growing the III-nitride channel region 203 with an appropriate dopant species such as magnesium. Since the anodes of the substrate diodes Sb1, Sb2 are (electrically) connected to the semiconductor substrate 200 as shown in FIGS. 1, 2, 4 and 6, the p-doped regions with their electrodes can be formed as separate regions which are electrically connected together or as a single p-doped region with its single electrode. Since both anode electrodes 208 are electrically connected together, a single common electrode 208' may be used as shown in FIG. 10B instead of two separate electrodes 208 as shown in FIG. 10A.

Figure 11B:
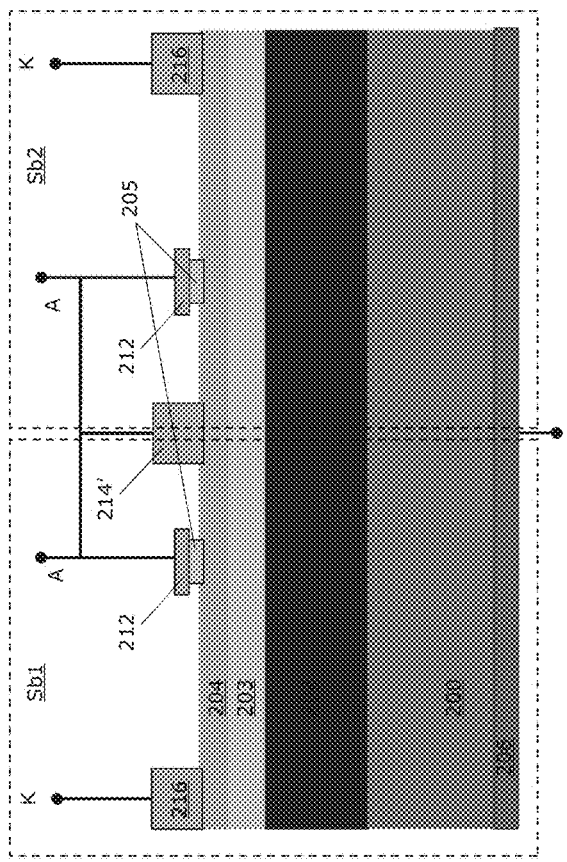
Figure 11A:
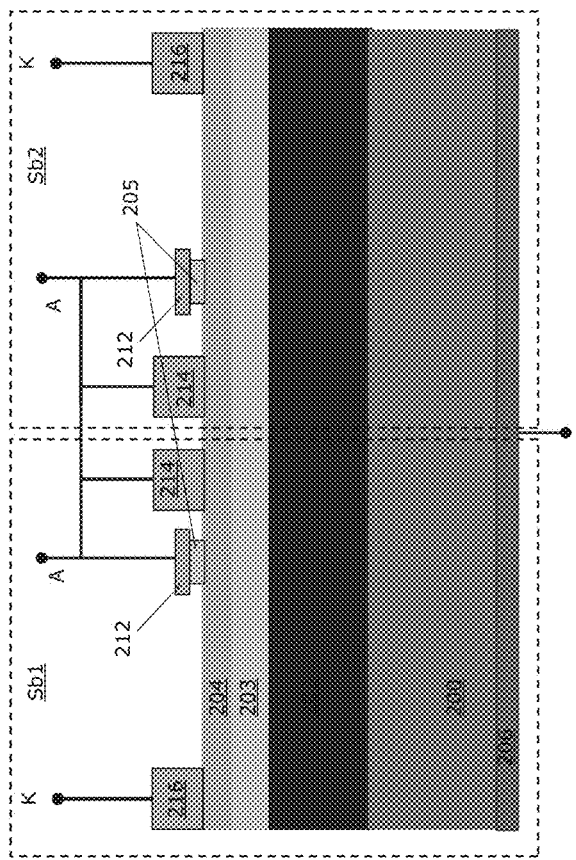

FIGS. 11A and 11B illustrate respective cross-sectional views of embodiments of the substrate diodes Sb1, Sb2 shown in FIGS. 1, 2, 4 and 6. According to the embodiments shown in FIGS. 11A and 11B, the substrate diodes Sb1, Sb2 are each implemented as a GaN transistor having its gate electrode 212 connected to one of its power electrodes 214 (e.g., source). The electrode 214 connected to the gate acts as the anode and the other electrode 216 is defined as the cathode. The anodes (A) and the gates (G) of the substrate diodes Sb1, Sb2 are (electrically) connected to the semiconductor substrate 200, and the p-doped anode regions can be formed as separate regions which are electrically connected together. Each cathode (K) of the substrate diodes Sb1, Sb2 is connected to Vss1 or Vss2, respectively. Since both electrodes 214 tied to the gates (G) in the substrate diodes Sb1 and Sb2 are electrically connected, a single common electrode 214' may be used as shown in FIG. 11B instead of two separate electrodes 214 as shown in FIG. 11A.

Figure 12:
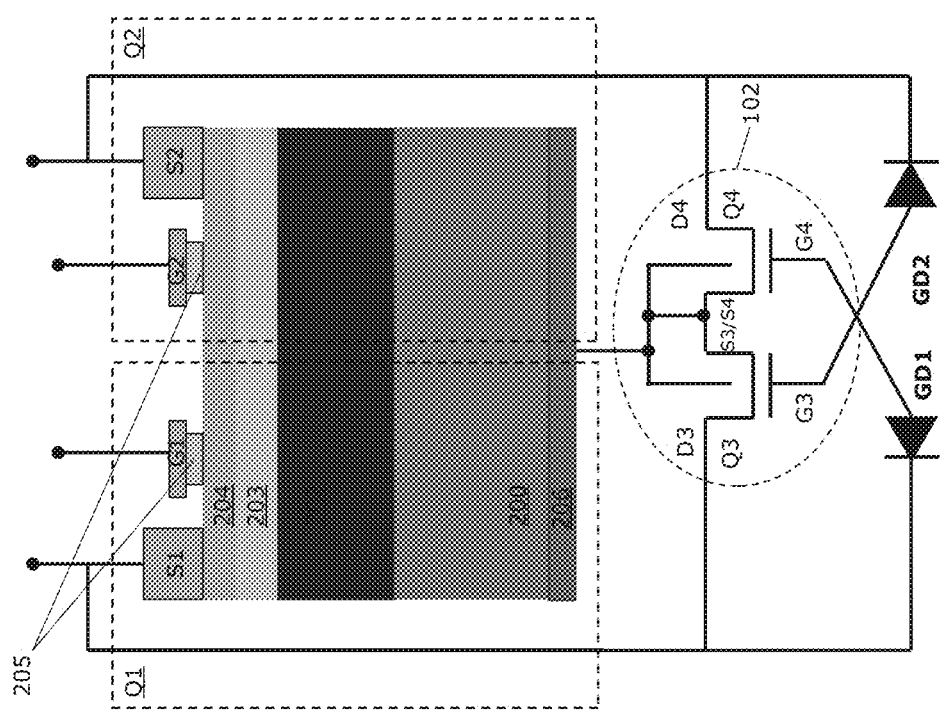

FIG. 12 illustrates a cross-sectional view of the circuit embodiment shown in FIG. 7, implemented as part of a compound semiconductor device in a III-nitride technology such as GaN. Similar to FIG. 9, the main bi-directional switch 100 is formed on a semiconductor substrate 200 such as a Si substrate or one or more epitaxially-grown or implanted Si layers on Si substrate. A III-nitride buffer region 202 is formed over the semiconductor substrate 200, a III-nitride channel region 203 (e.g., GaN) is formed over the III-nitride buffer region 202, and a III-nitride barrier region 204 is formed over the III-nitride channel region 203. Transistors Q1 and Q2 shown in FIG. 7 can be implemented as first and second gates G1, G2, first and second sources S1, S2, and a common drain. The common drain is positioned between the gates G1, G2. By spacing source S1 the same distance to gate G1 as source S2 is spaced to gate G2, the main bi-directional switch 100 is symmetric. FIG. 12 also schematically illustrates the discharge circuit 102 and corresponding auxiliary diodes GD1, GD2 shown in FIG. 7.

Figure 13B:
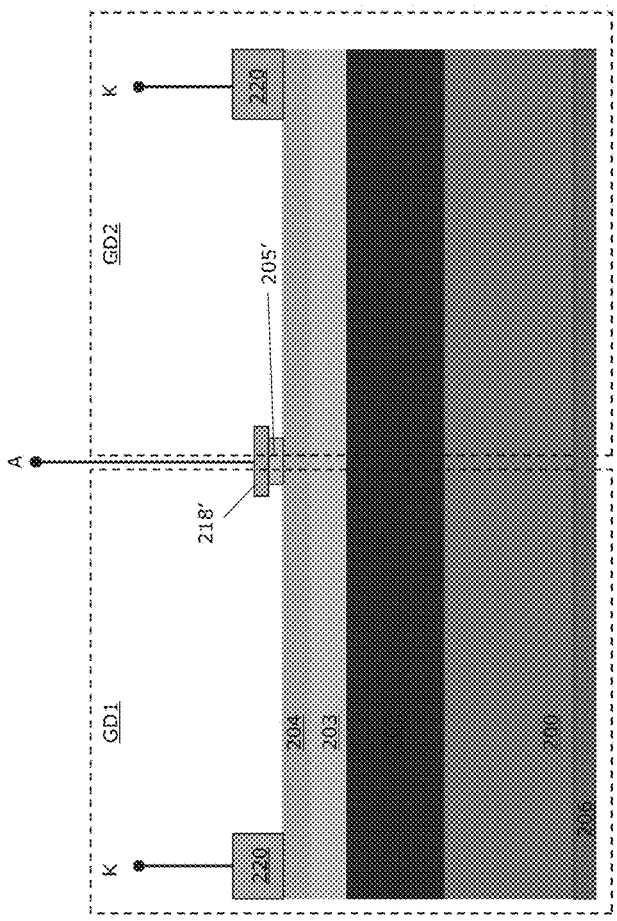
Figure 13A:
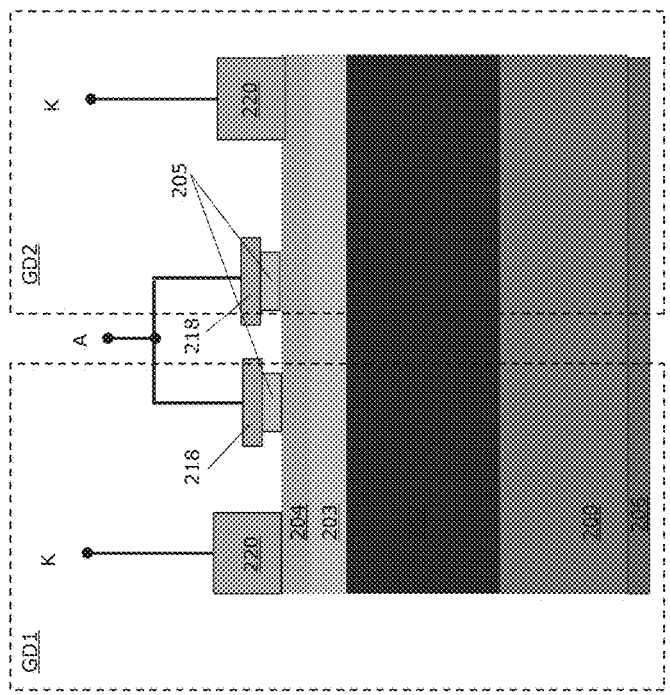

FIGS. 13A and 13B illustrate respective cross-sectional views of embodiments of the auxiliary diodes GD1, GD2 shown in FIG. 4. The auxiliary diodes GD1, GD2 are monolithically integrated with the main bi-directional switch 100 and the discharge circuit 102, which are out of view in FIGS. 13A and 13B. Each auxiliary diode GD1, GD2 can be a GaN diode that includes a p-doped region 205 (e.g., pGaN) with one electrode 218 as the anode (A) and another electrode 220 on III-nitride barrier 204 (i.e., AlGaN) as the cathode (K). A two-dimensional electron gas (2DEG) can be formed by spontaneous and piezoelectric polarization between the III-nitride channel region 203 and the III-nitride barrier region 204 in a diode region of the device. The p-doped anode regions 205 on the III-nitride barrier region 204 can be formed by doping or growing a III-nitride layer with an appropriate dopant species such as magnesium. Since the anode (A) of each auxiliary diode GD1, GD2 is (electrically) connected to one of the gates G3/G4 of the control transistors Q3, Q4 as shown in FIG. 4, the p-doped anode region 205 of each auxiliary diode GD1, GD2 can be formed as two separate regions with two separate electrodes 218 which are electrically connected together as shown in FIG. 13A, or instead as a single p-doped region 205' and corresponding single electrode 218' as shown in FIG. 13B.

Figure 14B:
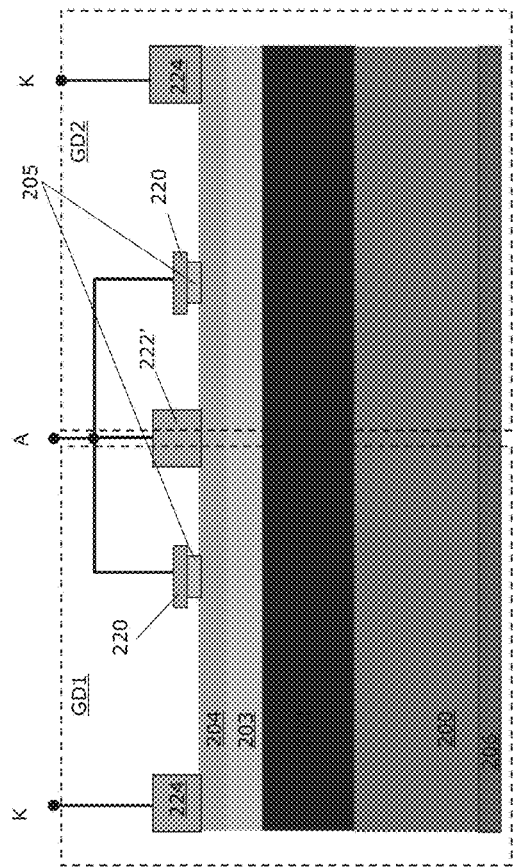
Figure 14A:
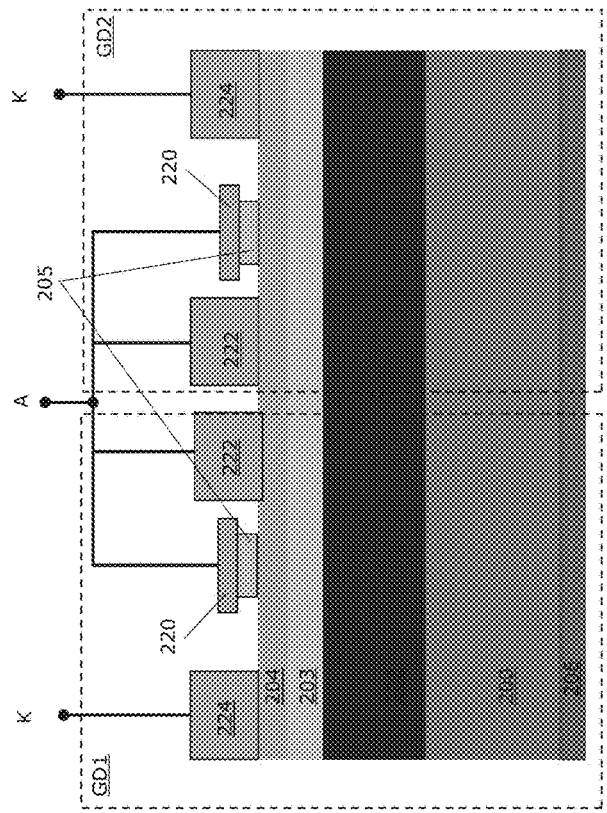

FIGS. 14A and 14B illustrate respective cross-sectional views of embodiments of the auxiliary diodes GD1, GD2 shown in FIG. 4. According to the embodiments shown in FIGS. 14A and 14B, the auxiliary diodes GD1, GD2 are each implemented as a GaN transistor having a gate (G) electrode 220 connected to a first electrode 222 (e.g., source). The other electrode 224 of each GaN transistor is defined as the cathode (K). The source region of each auxiliary diode GD1, GD2 can be formed as separate electrodes 222 which are electrically connected together as shown in FIG. 14A, or instead as a single electrode 222' as shown in FIG. 14B. Similarly, the p-doped regions 205 and gate electrodes 220 of each auxiliary diode GD1, GD2 can be formed as separate gate regions which are electrically connected together or as a single gate region.

Figure 15:
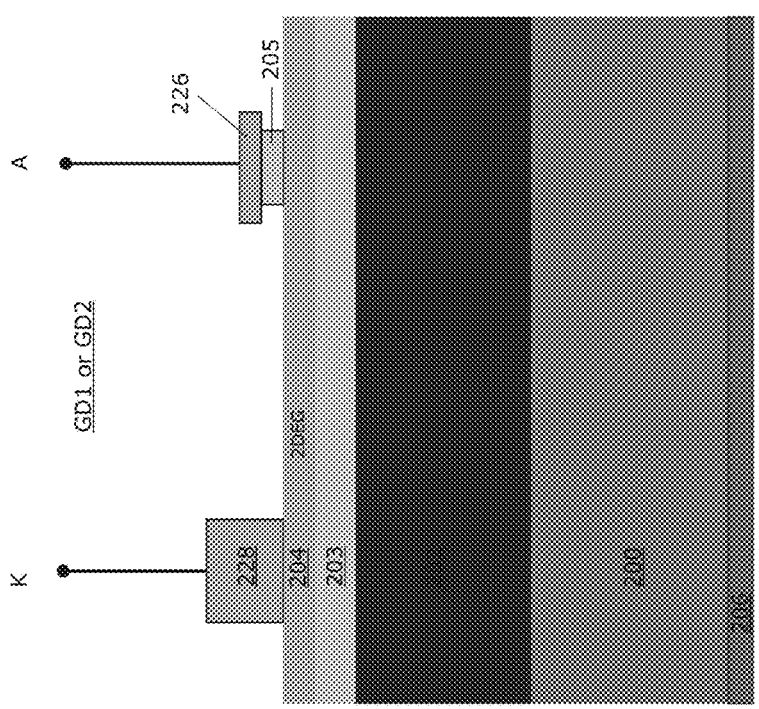

FIG. 15 illustrates a cross-sectional view of an embodiment of the auxiliary diodes GD1, GD2 shown in FIGS. 4, 6, 7, and 12. The auxiliary diodes GD1, GD2 are monolithically integrated with the main bi-directional switch 100 and the discharge circuit 102, which are out of view in FIG. 15. Each auxiliary diode GD1, GD2 can be a GaN diode that includes a p-doped region 205 (e.g., pGaN) with one electrode 226 as the anode (A) and another electrode 228 on the III-nitride barrier region 204 (e.g., AlGaN) as the cathode (K). A two-dimensional electron gas (2DEG) can be formed by spontaneous and piezoelectric polarization between the III-nitride channel region 203 and the III-nitride barrier region 204 in a diode region of the device. The p-doped anode region 205 on the III-nitride barrier region 204 can be formed by growing a III-nitride layer with an appropriate dopant species such as magnesium.

Figure 16:
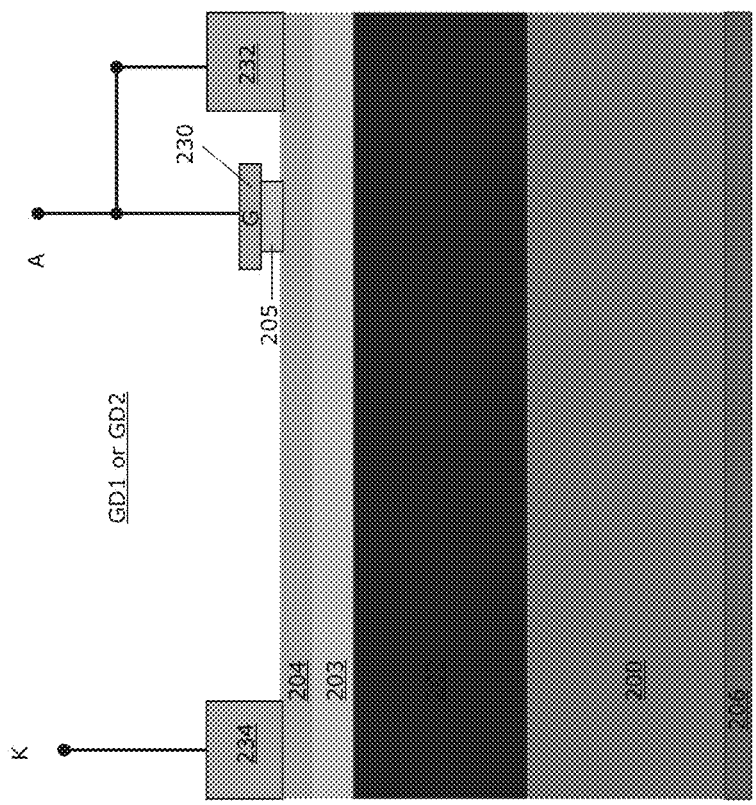

FIG. 16 illustrates a cross-sectional view of another embodiment of the auxiliary diodes GD1, GD2 shown in FIGS. 4, 6, 7 and 12. According to this embodiment, the auxiliary diode GD1, GD2 are each implemented as a GaN transistor having a gate (G) electrode 230 connected to one electrode 232 (e.g., source). The other electrode 234 of each GaN transistor is defined as the cathode (K).

Figure 17A:
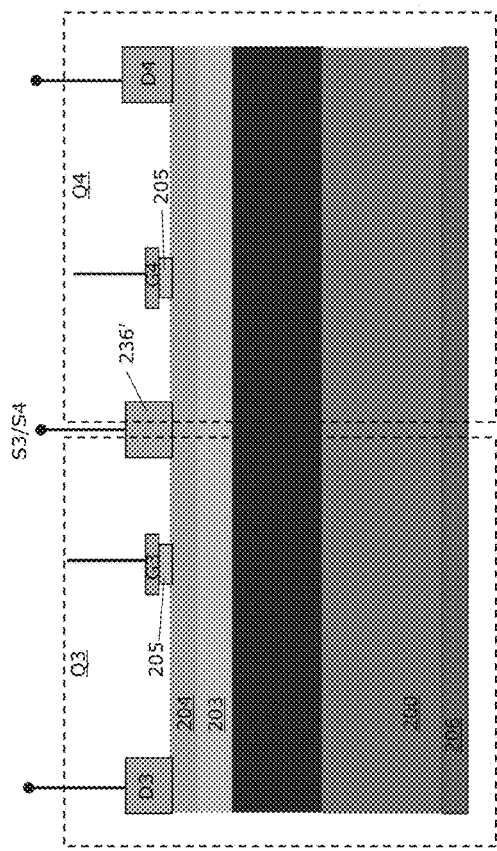
Figure 17B:
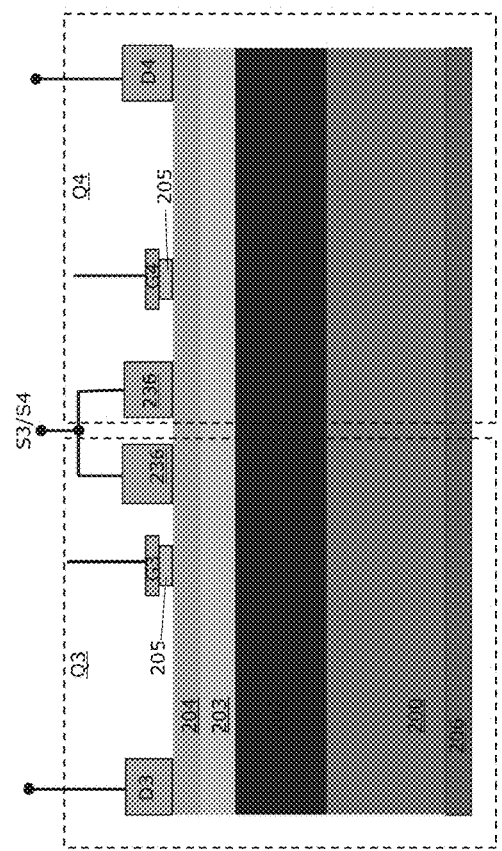

FIGS. 17A and 17B illustrate respective cross-sectional views of embodiments of the control transistors Q3, Q4 that form the monolithically integrated discharge circuit 102 shown in FIGS. 1, 2, 4, 6, 7 and 12. According to the embodiments shown in FIGS. 17A and 17B, the control transistors Q3, Q4 are implemented as individual GaN transistors or as an auxiliary bi-directional GaN switch monolithically integrated with the main bi-directional switch 100 which is out of view on FIG. 17. Both gates G3 and G4 are connected together in FIG. 1 and floating, and are separate and floating in FIG. 2. Gates G3 and G4 are connected to the corresponding anode of auxiliary diodes GD1 and GD2, respectively, in FIG. 4 and are disconnected to the corresponding anode of auxiliary diodes GD1 and GD2, respectively, in FIGS. 6, 7, and 12.

Transistors Q3 and Q4 of the discharge circuit 102 can be implemented as first and second gates G3, G4, first and second drains D3, D4, and a common source S3/S4 formed in the III-nitride heterostructure body 202/203/204. The common source S3/S4 is positioned between the gates G3, G4. The gates G3, G4 of the control transistors Q3, Q4 are each decoupled from gate drive circuitry as previously described herein. Hence, the gates G3, G4 of the discharge circuit 102 are controlled at least passively (and possibly actively) and based on the state of the main bi-directional switch 100. The common source region S3/S4 can be formed as separate electrodes 236 which are electrically connected together as shown in FIG. 17A, or instead as a single electrode 236' as shown in FIG. 17B.

Figure 18:
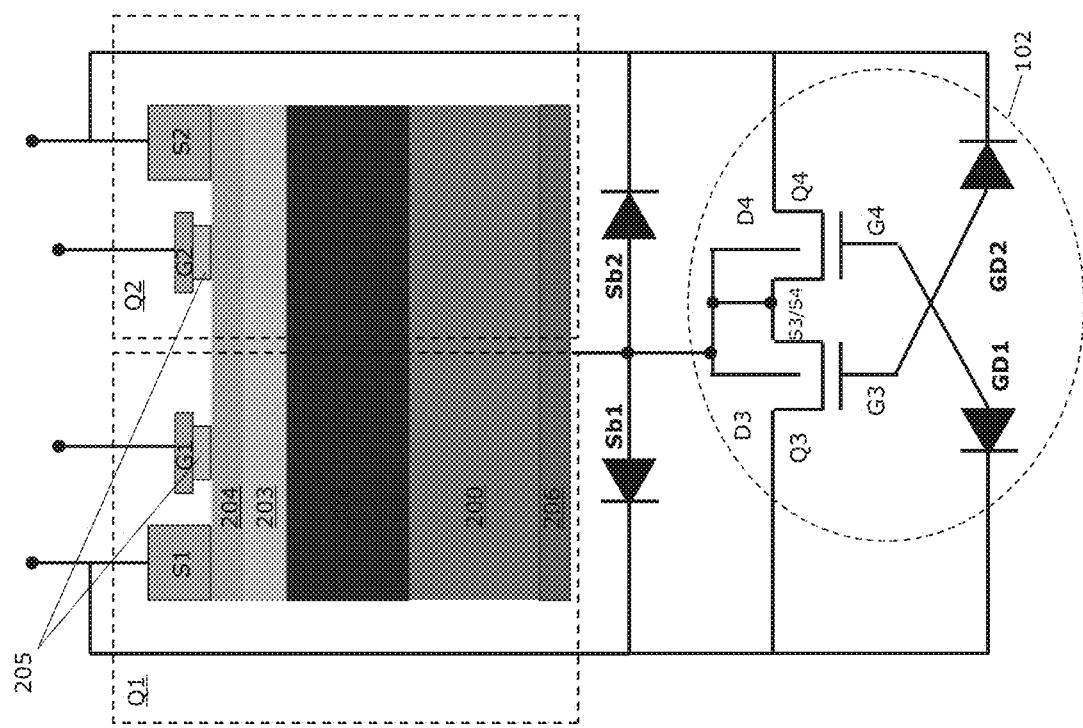

FIG. 18 illustrates a cross-sectional view of the circuit embodiment shown in FIG. 6, implemented as part of a compound semiconductor device in III-nitride technology such as GaN. Similar to FIG. 9, the main bi-directional switch 100 is formed on a semiconductor substrate 200 such as a Si substrate and one or more optional buffer layers. A III-nitride buffer region 202 is formed over the semiconductor substrate 200, a III-nitride channel region 203 (e.g., GaN) is formed over the III-nitride buffer region 202, and a III-nitride barrier region 204 is formed over the III-nitride channel region 203. The main transistors Q1 and Q2 shown in FIG. 6 can be implemented as first and second gates G1, G2, first and second sources S1, S2, and a common drain. The common drain is positioned between the gates G1, G2. FIG. 18 also schematically illustrates the discharge circuit 102 with the auxiliary diodes GD1, GD2 and the substrate diodes Sb1, Sb2 shown in FIG. 6.

As previously explained herein, the substrate diodes Sb1, Sb2 and the auxiliary diodes GD1, GD2 shown in FIGS. 6 and 18 can each be monolithically integrated with the main bi-directional switch 100 and the discharge circuit 102, e.g., as shown in FIGS. 13A through 16. For example, each substrate diode Sb1 and Sb2 shown in FIGS. 6 and 18 can be a GaN diode that includes a p-doped region (e.g., pGaN) with an electrode (Anode, A) and a two-dimensional electron hole gas (2DEG) with another electrode (Cathode, K). The 2DEG can be formed by spontaneous and piezoelectric polarization between the III-nitride channel region 203 and the III-nitride barrier region 204 in a diode region of the device. The p-doped regions 205 on the III-nitride barrier region 204 can be formed by doping a III-nitride layer 203 with an appropriate dopant species such as magnesium. Since the anodes of the substrate diodes Sb1, Sb2 are (electrically) connected to the semiconductor substrate 200 as shown in FIGS. 6 and 18, the p-doped regions with their electrodes can be formed as separate regions which are electrically connected together or as a single p-doped region with its single electrode. In another embodiment, the substrate diodes Sb1, Sb2 are each implemented as a GaN transistor having its gate (G) connected to one of its electrodes. The electrode connected to the gate acts as the anode and the other electrode is defined as the cathode. Both anodes are electrically connected to each other while each cathode is connected to Vss1 or Vss2, e.g., shown in FIG. 6. Since both electrodes tied to the gates in the substrate gated diodes Sb1 and Sb2 are electrically connected, a single common electrode can be used instead of two separate electrodes. Each auxiliary diode GD1, GD2 may include a p-doped region 205 (e.g., pGaN) with its electrode as the anode and another electrode on the III-nitride barrier region 204 (e.g., AlGaN) as the cathode. A two-dimensional electron gas (2DEG) can be formed by spontaneous and piezoelectric polarization between the III-nitride channel region 203 and the III-nitride barrier region 204 in a diode region of the device. The p-doped anode regions 205 on the III-nitride barrier region 204 can be formed by growing a III-nitride layer with an appropriate dopant species such as magnesium. In yet another embodiment, the auxiliary diode GD1, GD2 may be each implemented as a GaN transistor having its gate (G) connected to its electrodes (e.g., source). Since the anode of each auxiliary diode GD1, GD2 is (electrically) connected to one of the gates G3/G4 of the control transistors Q3, Q4 e.g. as shown in FIGS. 6 and 18, the p-doped anode region 205 of each auxiliary diode GD1, GD2 may be formed as two separate regions.

Similar to the control transistors Q3, Q4 that form the monolithically integrated discharge circuit 102 shown in FIGS. 6 and 18, the control transistors Q3, Q4 may be implemented as a pair of individual GaN transistors or an auxiliary bi-directional GaN switch monolithically integrated with the main bi-directional switch 100, e.g., as shown in FIGS. 17A and 17B. For example, the control transistors Q3 and Q4 of the discharge circuit 102 can be implemented as first and second gates G3, G4, first and second drains D3, D4, and a common source S3/S4 formed in the III-nitride heterostructure body 202/203/204. The common source S3/S4 is positioned between the gates G3, G4. The gates G3, G4 of the control transistors Q3, Q4 are each decoupled from gate drive circuitry as previously described herein. Hence, the gates G3, G4 of the discharge circuit 102 are controlled at least passively (and possibly actively) and based on the state of the main bi-directional switch 100. The common source region S3/S4 can be formed as separate electrodes which are electrically connected together or as a single electrode.

Figure 19:
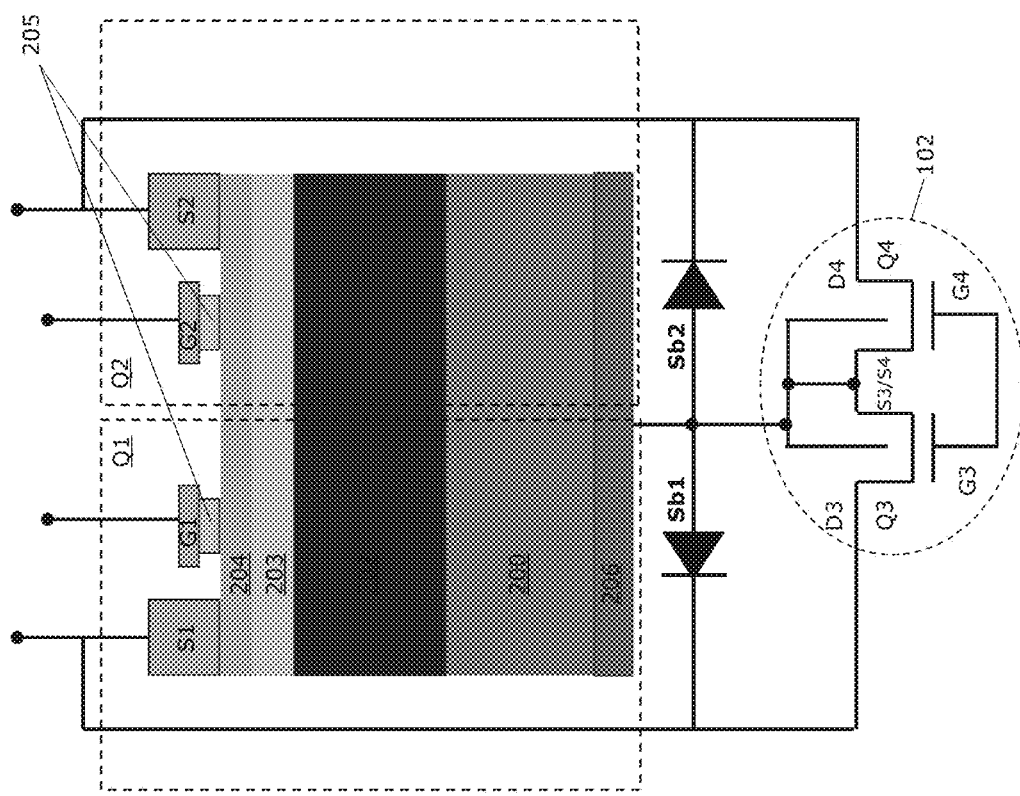

FIG. 19 illustrates a cross-sectional view of the circuit embodiment shown in FIG. 1, implemented as part of a compound semiconductor device in III-nitride technology such as GaN. Similar to FIG. 9, the main bi-directional switch 100 is formed on a semiconductor substrate 200 such as a Si substrate or one or more epitaxially-grown or implanted Si layers on Si substrate. A III-nitride buffer region 202 is formed over the semiconductor substrate 200, a III-nitride channel region 203 (e.g., GaN) is formed over the III-nitride buffer region 202, and a III-nitride barrier region 204 is formed over III-nitride channel region 203. The main transistors Q1 and Q2 shown in FIG. 1 can be implemented as first and second gates G1, G2, first and second sources S1, S2, and a common drain. The common drain is positioned between the gates G1, G2. FIG. 19 also schematically illustrates the discharge circuit 102 and the substrate diodes Sb1, Sb2 shown in FIG. 1.

As previously explained herein, the substrate diodes Sb1, Sb2 shown in FIGS. 1 and 19 can be a GaN diode that includes a p-doped region 205 (e.g., pGaN) with an electrode (Anode, A) and a two-dimensional electron hole gas (2DEG) with another electrode (Cathode, K), e.g., as shown in FIGS. 10A and 10B. The 2DEG can be formed by spontaneous and piezoelectric polarization between the III-nitride channel region 203 and the III-nitride barrier region 204 in a diode region of the device. The p-doped regions 205 on the III-nitride barrier region 204 can be formed by doping a III-nitride layer 203 with an appropriate dopant species such as magnesium. Since the anodes of the substrate diodes Sb1, Sb2 are (electrically) connected to the semiconductor substrate 200 as shown in FIG. 1, the p-doped anode regions can be formed as separate regions which are electrically connected together e.g. as shown in FIG. 10A, or as a single p-doped region e.g. as shown in FIG. 10B.

The substrate diodes Sb1, Sb2 can instead be implemented as respective GaN transistors each having its gate (G) connected to its source (S), e.g., as shown in FIGS. 11A and 11B. Since the anodes and the gates of the substrate diodes Sb1, Sb2 are (electrically) connected to the semiconductor substrate 200, the p-doped anode regions 205 can be formed as separate regions which are electrically connected together or as a single p-doped region.

Figure 24:
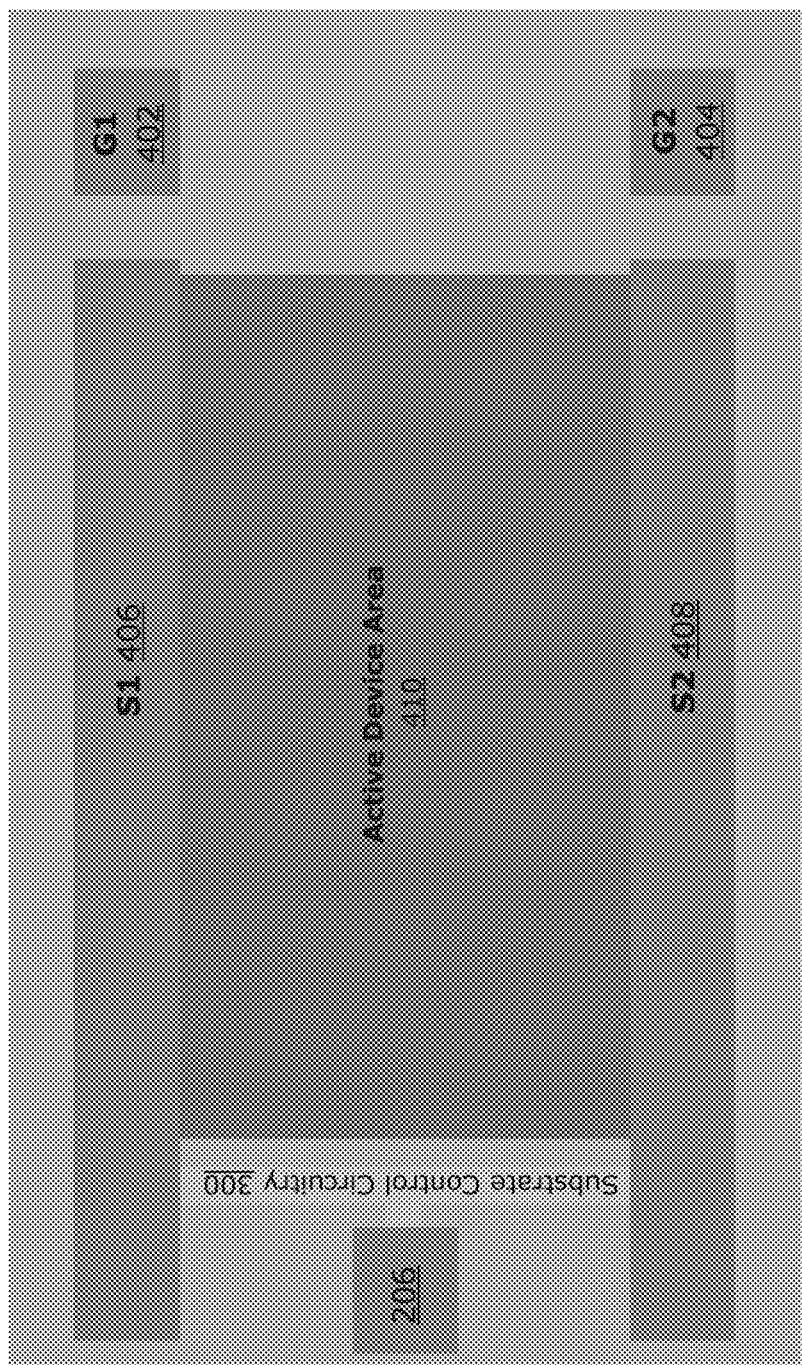
FIG. 24 illustrates a top plan view of the compound semiconductor device shown in FIG. 23.

Similarly, the control transistors Q3, Q4 that form the monolithically integrated discharge circuit 102 shown in FIGS. 1 and 24 can be implemented as first and second gates G3, G4, first and second drains D3, D4, and a common source S3/S4 formed in the III-nitride heterostructure body 202/203/204, e.g., as shown in FIGS. 17A and 17B. The common source S3/S4 is positioned between the gates G3, G4. The gates G3, G4 of the control transistors Q3 and Q4 are each decoupled from gate drive circuitry as previously described herein. Hence, the gates G3, G4 of the discharge circuit 102 are controlled at least passively (and possibly actively) and based on the state of the main bi-directional switch 100. The common source region S3/S4 can be formed as separate electrodes which are electrically connected together or as a single electrode. The gates G3, G4 of the monolithically integrated control transistors Q3, Q4 are connected together may be floating. This connection can be formed by a metal line, for example. The connection can be omitted so that the gates G3, G4 of the monolithically integrated control transistors Q3, Q4 are disconnected from one another and each floating, for example as shown in FIG. 2.

Figure 20:
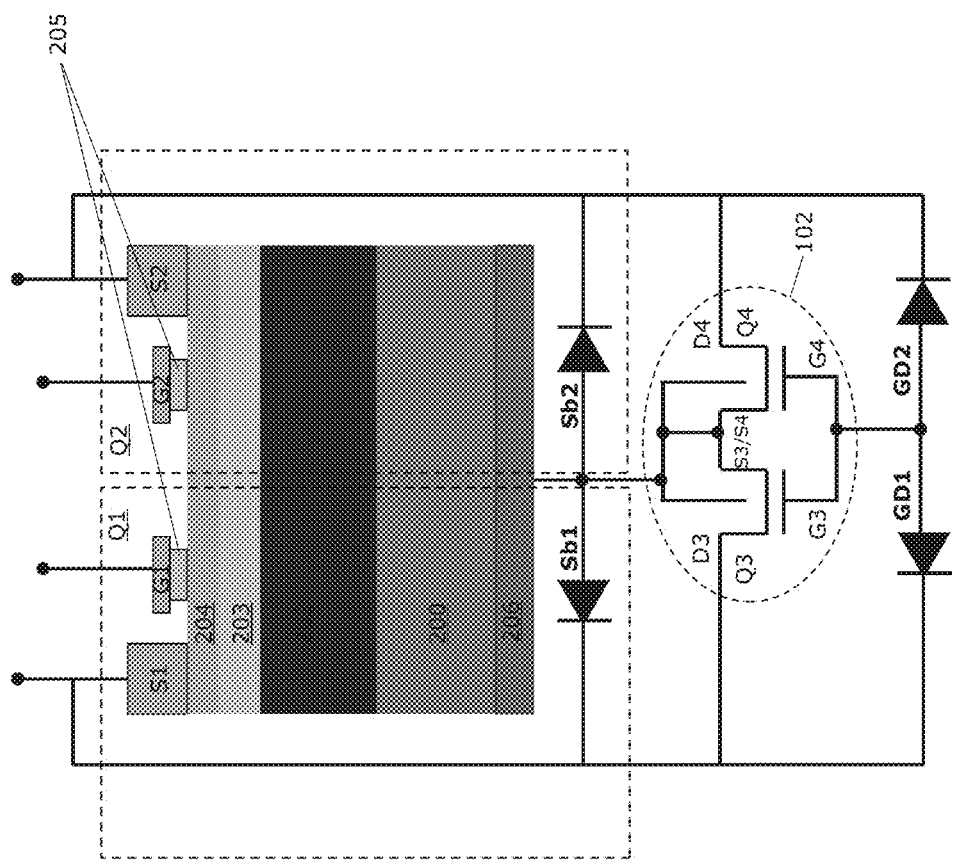

FIG. 20 illustrates a cross-sectional view of the circuit embodiment shown in FIG. 4, implemented as part of a compound semiconductor device in III-nitride technology such as GaN. Similar to FIG. 9, the main bi-directional switch 100 is formed on a semiconductor substrate 200 such as a Si substrate and one or more optional buffer layers. A III-nitride buffer region 202 is formed over the semiconductor substrate 200, a III-nitride channel region 203 (e.g., GaN) is formed over the III-nitride buffer region 202, and a III-nitride barrier region 204 is formed over the III-nitride channel region 203. Transistors Q1 and Q2 show in FIG. 4 can be implemented as first and second gates G1, G2, first and second sources S1, S2, and a common drain. The common drain is positioned between the gates G1, G2. FIG. 20 also schematically illustrates the discharge circuit 102, the substrate diodes Sb1, Sb2 and the auxiliary diodes GD1, GD2 shown in FIG. 4.

Each diode Sb1, Sb2, GD1, GD2 is monolithically integrated with the main bi-directional switch 100 and the discharge circuit 102, and can be a p-doped region 205 (e.g., pGaN) with an electrode (Anode, A) and a two-dimensional electron gas (2DEG) with another electrode (Cathode, K), e.g., as shown in FIGS. 10A and 10B for the substrate diodes Sb1, Sb2 and FIGS. 13A and 13B for the auxiliary diodes GD1, GD2. The 2DEG can be formed by spontaneous and piezoelectric polarization between the III-nitride channel region 203 and the III-nitride barrier region 204 in a diode region of the device. The p-doped regions 205 on the III-nitride barrier region 204 can be formed by doping a III-nitride layer 203 with an appropriate dopant species such as magnesium. The anode of each auxiliary diode GD1, GD2 is (electrically) connected to one of the gates G3/G4 of the control transistors Q3, Q4 as shown in FIGS. 4 and 20. The p-doped anode region of each auxiliary diode GD1, GD2 can be formed as two separate regions which are electrically connected together or as a single p-doped region. In the case of the substrate diodes Sb1, Sb2, the anodes are (electrically) connected to the semiconductor substrate 200 as shown in FIG. 4 and can be formed as separate p-doped regions which are electrically connected together or as a single p-doped region.

Each diode Sb1, Sb2, GD1, GD2 can be implemented as a GaN transistor having its gate (G) connected to its source (S), e.g., as shown in FIGS. 11A and 11B for the substrate diodes Sb1, Sb2 and FIGS. 14A and 14B for the auxiliary diodes GD1, GD2. The anodes of the substrate diodes Sb1, Sb2 and the auxiliary diodes GD1, GD2 are (electrically) connected to the semiconductor substrate 200. The gate regions of the substrate diodes Sb1, Sb2 and the auxiliary diodes GD1, GD2 are formed as separate regions which are electrically connected together.

The control transistors Q3, Q4 that form the monolithically integrated discharge circuit 102 shown in FIGS. 4 and 20 can be implemented as first and second gates G3, G4, first and second drains D3, D4, and a common source S3/S4 formed in the III-nitride heterostructure body 202/203/204, e.g., as shown in FIGS. 17A and 17B. The common source S3/S4 is positioned between the gates G3, G4. The gates G3, G4 of the control transistors Q3 and Q4 are each decoupled from gate drive circuitry as previously described herein. Hence, the gates G3, G4 of the discharge circuit 102 are controlled at least passively (and possibly actively) and based on the state of the main bi-directional switch 100. The common source region S3/S4 can be formed as separate electrodes which are electrically connected together or as a single electrode.

The control transistors Q3 and Q4 of the monolithically integrated discharge circuit 102 can be high ohmic devices i.e. devices having a higher Rdson (on-state resistance) than the transistors Q1, Q2 of the main bi-directional switch 100. By using high ohmic devices, significant active area or change to the overall design is not required to monolithically integrate the discharge circuit 102 with the main bi-directional switch 100. For example, the control transistors Q3 and Q4 of the discharge circuit 102 may have an Rdson greater than 1 Ohm, and/or the size of control transistors Q3 and Q4 may be between $\frac{1}{50}$ and $\frac{1}{100}$ the size of the main bi-directional switch 100.

The main bi-directional switch 100 and monolithically integrated discharge circuit 102 can form part of a power circuit, wherein the main bi-directional switch 100 enables bi-directional current flow within the power circuit. For example, the power circuit can be a bridgeless PFC (power factor correction) stage, a solar microinverter, an AC-DC converter, an AC-AC converter, an AC flyback converter, etc. Still other types of power circuits having bi-directional current flow can use the main bi-directional switch 100 and monolithically integrated discharge circuit 102.

Figure 21:
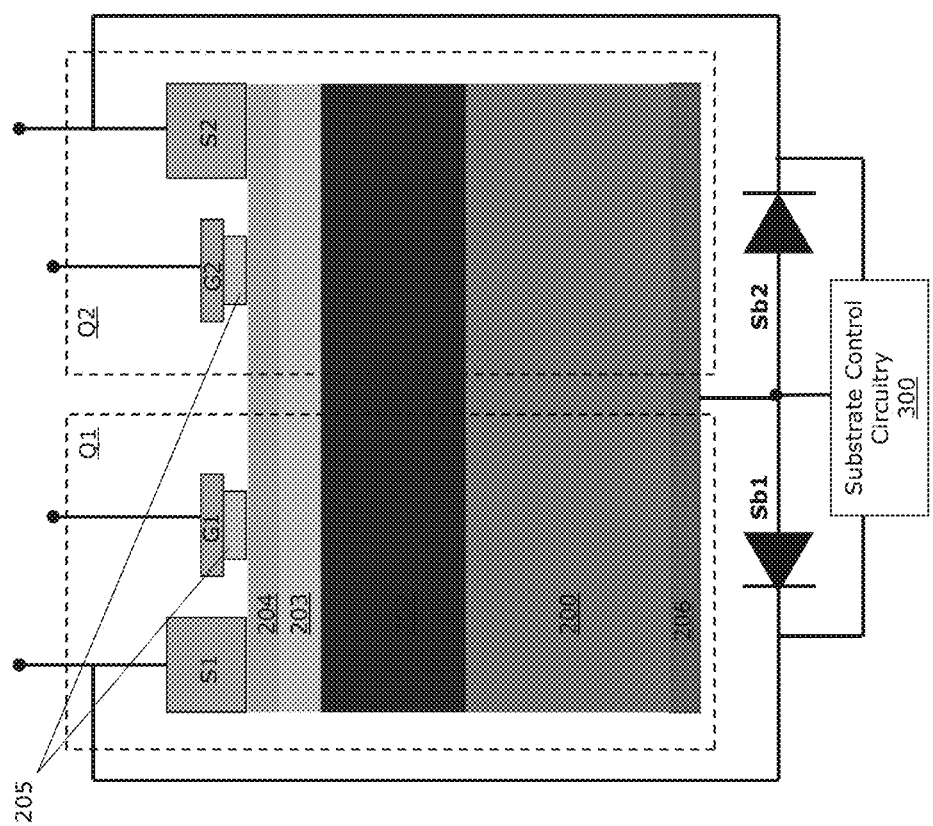
FIG. 21 illustrates a cross-sectional view of another embodiment of a compound semiconductor device implemented in a III-nitride technology and including a main bi-directional switch and a discharge circuit for providing a substrate discharge path during the off-to-on switching of the bi-directional switch.

FIG. 21 illustrates a cross-sectional view of an embodiment of the main bi-directional switch 100, implemented as part of a compound semiconductor device in III-nitride technology such as GaN high electron mobility transistor (HEMT). The embodiment shown in FIG. 21 is similar to the embodiment shown in FIG. 9. In addition, substrate control circuitry 300 is also shown which is electrically connected to the substrate 200.

Figure 22:
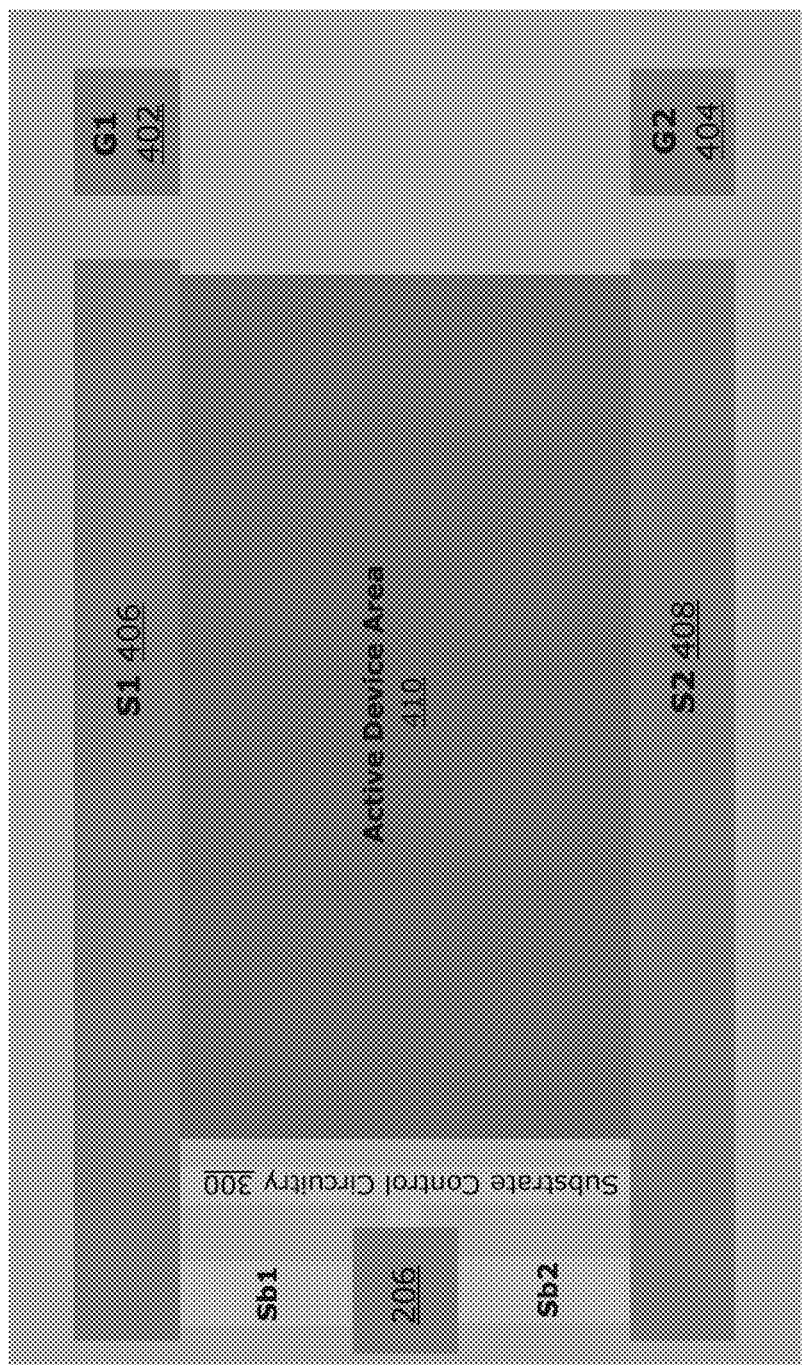
FIG. 22 illustrates a top plan view of the compound semiconductor device shown in FIG. 21.

FIG. 22 illustrates a top plan view of a semiconductor die (chip) 400 that includes the compound semiconductor device shown in FIG. 21. The semiconductor die 400 also includes respective gate electrodes 402, 404 for providing points of external electrical connection to the gates (G1, G2) of the transistors Q1, Q2 of the main bi-directional switch 100, and respective source electrodes 406, 408 for providing points of external electrical connection to the sources (S1, S2) of the transistors Q1, Q2 of the main bi-directional switch 100. The transistors Q1, Q2 of the main bi-directional switch 100 are implemented in an active device area 410 of the semiconductor die 400. The semiconductor die 400 further includes a substrate electrode 206 for providing a point of external electrical connection to the semiconductor substrate 200. The electrodes 206, 402, 404, 406, 408 may be provided as one or more patterned metallization layers of the semiconductor die 400.

Figure 23:
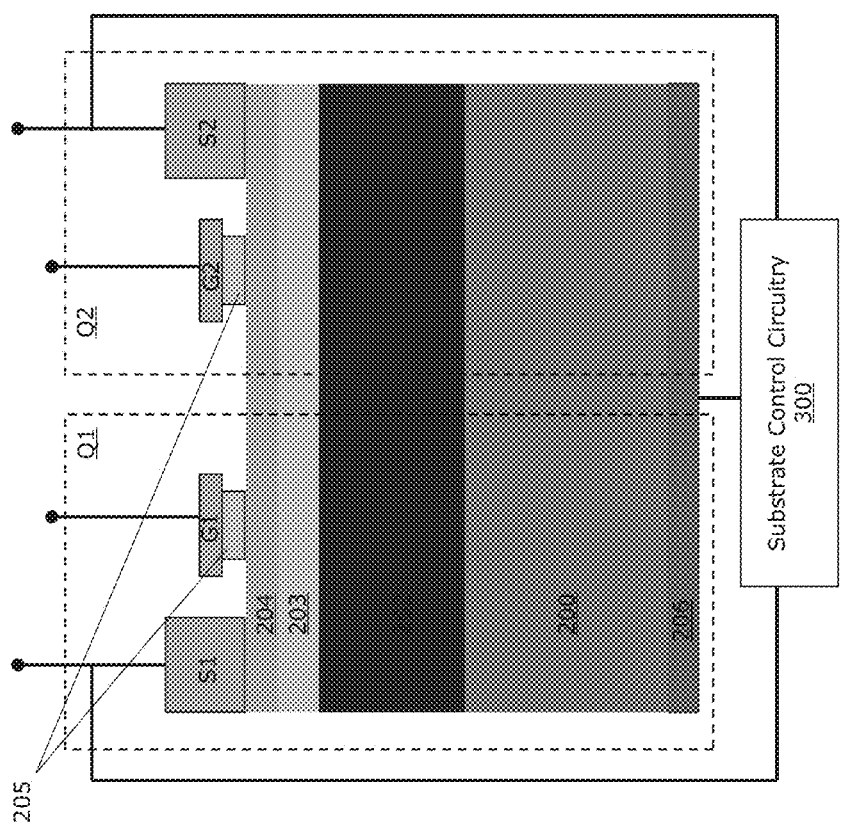
FIG. 23 illustrates a cross-sectional view of another embodiment of a compound semiconductor device implemented in a III-nitride technology and including a main bi-directional switch and a discharge circuit for providing a substrate discharge path during the off-to-on switching of the bi-directional switch.

FIG. 23 illustrates a cross-sectional view of another embodiment of the main bi-directional switch 100, implemented as part of a compound semiconductor device in III-nitride technology such as GaN high electron mobility transistor (HEMT). The embodiment shown in FIG. 23 is similar to the embodiment shown in FIG. 21. Different, however, the substrate diodes Sb1 and Sb2 are omitted.

FIG. 24 illustrates a top plan view of a semiconductor die (chip) 500 that includes the compound semiconductor device shown in FIG. 23. The semiconductor die 500 also includes respective gate electrodes 402, 404 for providing points of external electrical connection to the gates (G1, G2) of the transistors Q1, Q2 of the main bi-directional switch 100, and respective source electrodes 406, 408 for providing points of external electrical connection to the sources (S1, S2) of the transistors Q1, Q2 of the main bi-directional switch 100, as explained above. The semiconductor die 400 further includes a substrate electrode 206 for providing a point of external electrical connection to the semiconductor substrate 200, as explained above.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   a main bi-directional switch formed on a semiconductor substrate and comprising first and second gates, a first source electrically connected to a first voltage terminal, a second source electrically connected to a second voltage terminal, and a common drain; and
   a discharge circuit comprising a plurality of individual transistors or an auxiliary bi-directional switch monolithically integrated with the main bi-directional switch and connected in a common source configuration to the semiconductor substrate, the plurality of individual transistors or the auxiliary bi-directional switch comprising a first drain connected to the first source of the main bi-directional switch, a second drain connected to the second source of the main bi-directional switch, and first and second gates each decoupled from gate drive circuitry,
   wherein the first and the second gates of the discharge circuit are controlled at least passively to switch the plurality of individual transistors or the auxiliary bi-directional switch from an off state to an on state and discharge the semiconductor substrate, based on a state of the main bi-directional switch.

2. The semiconductor device of claim 1,
   wherein the main bi-directional switch has four primary operational states: OFF/OFF in which both gates of the main bi-directional switch are off; ON/ON in which both gates of the main bi-directional switch are on; ON/OFF in which the first gate of the main bi-directional switch is on and the second gate of the main bi-directional switch is off; and OFF/ON in which the first gate of the main bi-directional switch is off and the second gate of the main bi-directional switch is on,
   wherein the discharge circuit is configured to automatically discharge the semiconductor substrate to the first voltage terminal and/or the second voltage terminal responsive to the main bi-directional switch transitioning from the ON/OFF state or the OFF/ON state to the ON/ON state.

3. The semiconductor device of claim 1, further comprising:
   a first diode and a second diode monolithically integrated with the main bi-directional switch,
   wherein the anode of the first diode and the anode of the second diode are connected to the semiconductor substrate,
   wherein the cathode of the first diode is connected to the first source of the main bi-directional switch,
   wherein the cathode of the second diode is connected to the second source of the main bi-directional switch.

4. The semiconductor device of claim 3, wherein the first and the second gates of the plurality of individual transistors or the auxiliary bi-directional switch of the discharge circuit are connected together and floating.

5. The semiconductor device of claim 3, wherein the first and the second gates of the plurality of individual transistors or the auxiliary bi-directional switch of the discharge circuit are disconnected from one another and each floating.

6. The semiconductor device of claim 3, wherein the first diode and the second diode are each a GaN diode comprising a p-doped region and a first electrode as the anode, and a two-dimensional electron gas and a second electrode as the cathode.

7. The semiconductor device of claim 3, wherein the first diode and the second diode are each a GaN transistor having a gate connected to a source or a drain.

8. The semiconductor device of claim 1, further comprising:
   a first diode and a second diode monolithically integrated with the main bi-directional switch,
   wherein the anode of the first diode is connected to the first gate of the plurality of individual transistors or the auxiliary bi-directional switch of the discharge circuit,
   wherein the cathode of the first diode is connected to the first source of the main bi-directional switch,
   wherein the anode of the second diode is connected to the second gate of the plurality of individual transistors or the auxiliary bi-directional switch of the discharge circuit,
   wherein the cathode of the second diode is connected to the second source of the main bi-directional switch.

9. The semiconductor device of claim 8, wherein the first diode and the second diode are each a GaN diode comprising a p-doped region and a first electrode as the anode, and a two-dimensional electron gas and a second electrode as the cathode.

10. The semiconductor device of claim 8, wherein the first diode and the second diode are each a GaN transistor having gate connected to a source or a drain.

11. The semiconductor device of claim 8, further comprising:
a third diode and a fourth diode monolithically integrated with the main bi-directional switch,
wherein the anode of the third diode and the anode of the fourth diode are connected to the semiconductor substrate,
wherein the cathode of the third diode is connected to the first source of the main bi-directional switch,
wherein the cathode of the fourth diode is connected to the second source of the main bi-directional switch.

12. The semiconductor device of claim 1, further comprising:
a first diode and a second diode monolithically integrated with the main bi-directional switch,
wherein the anode of the first diode is connected to the second gate of the plurality of individual transistors or the auxiliary bi-directional switch of the discharge circuit,
wherein the cathode of the first diode is connected to the first source of the main bi-directional switch,
wherein the anode of the second diode is connected to the first gate of the plurality of individual transistors or the auxiliary bi-directional switch of the discharge circuit,
wherein the cathode of the second diode is connected to the second source of the main bi-directional switch.

13. The semiconductor device of claim 12, wherein the first diode and the second diode are each a GaN diode comprising a p-doped region and a first electrode as the anode, and a two-dimensional electron gas and a second electrode as the cathode.

14. The semiconductor device of claim 12, wherein the first diode and the second diode are each a GaN transistor having a gate connected to a source or a drain.

15. The semiconductor device of claim 12, further comprising:
a third diode and a fourth diode monolithically integrated with the main bi-directional switch,
wherein the anode of the third diode and the anode of the fourth diode are connected to the semiconductor substrate,
wherein the cathode of the third diode is connected to the first source of the main bi-directional switch,
wherein the cathode of the fourth diode is connected to the second source of the main bi-directional switch.

16. The semiconductor device of claim 12, wherein the semiconductor device is devoid of diode connections between the first source of the main bi-directional switch and the semiconductor substrate, and between the second source of the main bi-directional switch and the semiconductor substrate.

17. The semiconductor device of claim 1, wherein the main bi-directional switch and the plurality of individual transistors or the auxiliary bi-directional switch are each GaN devices.

18. The semiconductor device of claim 1, wherein the plurality of individual transistors or the auxiliary bi-directional switch has an Rdson greater than 1 Ohm, and/or wherein the plurality of individual transistors or the auxiliary bi-directional switch is between 1/50 and 1/100 the size of the main bi-directional switch.

19. The semiconductor device of claim 1, wherein the plurality of individual transistors comprises a plurality of individual HEMT devices connected in a common source configuration so that a first drain provides source functionally in a first direction and a second drain provides the source functionality in a second direction opposite the first direction.

20. A power circuit comprising the semiconductor device of claim 1, wherein the main bi-directional switch is configured to enable bi-directional current flow within the power circuit.

21. The semiconductor device of claim 1, wherein the plurality of individual transistors or the auxiliary bi-directional switch are each implemented as a GaN high electron mobility transistor (HEMT).

22. The semiconductor device of claim 21, wherein the first and second gates each comprises a pGaN doped region.

* * * * *